(12) United States Patent
Ali et al.

(10) Patent No.: US 10,547,319 B2
(45) Date of Patent: Jan. 28, 2020

(54) BACKGROUND CALIBRATION OF REFERENCE, DAC, AND QUANTIZATION NON-LINEARITY IN ADCS

(71) Applicant: Analog Devices, Inc., Norwood, MA (US)

(72) Inventors: Ahmed Mohamed Abdelatty Ali, Oak Ridge, NC (US); Paridhi Gulati, Sunnyvale, CA (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 16/138,942

(22) Filed: Sep. 21, 2018

(65) Prior Publication Data

US 2019/0131992 A1    May 2, 2019

Related U.S. Application Data

(60) Provisional application No. 62/580,333, filed on Nov. 1, 2017.

(51) Int. Cl.
| | |
|---|---|
| *H03M 1/10* | (2006.01) |
| *H03M 1/12* | (2006.01) |
| *H03M 1/16* | (2006.01) |
| *H03M 1/06* | (2006.01) |

(52) U.S. Cl.
CPC ....... *H03M 1/1028* (2013.01); *H03M 1/0687* (2013.01); *H03M 1/121* (2013.01); *H03M 1/167* (2013.01)

(58) Field of Classification Search
CPC .... H03M 1/12; H03M 1/1028; H03M 1/0687; H03M 1/121; H03M 1/167; H03M 1/10; H03M 1/1009; H03M 1/1071; H03M 2201/63; H03M 3/38

USPC ................................. 341/118, 155, 166, 120
See application file for complete search history.

(56) References Cited

U.S. PATENT DOCUMENTS

| | | | |
|---|---|---|---|
| 6,734,818 B2 | 5/2004 | Galton | |
| 6,784,814 B1 * | 8/2004 | Nair | .................... H03M 1/0641 |
| | | | 341/118 |
| 8,723,707 B2 | 5/2014 | Ali | |
| 9,143,147 B1 | 9/2015 | Ray et al. | |
| 9,503,116 B2 * | 11/2016 | Speir | .................. H03M 1/1019 |

(Continued)

OTHER PUBLICATIONS

Brooks et al., *Background Calibration of Pipelined ADCs via Decision Boundary Gap Estimation*, IEEE Transactions on Circuit and Systems—I: Regular Papers, vol. 55, No. 10, Nov. 2008, 11 pages.

(Continued)

*Primary Examiner* — Jean B Jeanglaude
(74) *Attorney, Agent, or Firm* — Patent Capital Group

(57) ABSTRACT

Multi-step ADCs performs multi-step conversion by generating a residue for a subsequent stage to digitize. To generate a residue, a stage in the multi-step ADC would reconstruct the input signal to the stage using a feedforward digital to analog converter (DAC). Non-linearities in the DAC can directly affect the overall performance of the multi-step ADC. To reduce power consumption and complexity of analog circuit design, digital background calibration schemes are implemented to address the non-linearities. The non-linearities that the calibration schemes address can include reference, DAC, and quantization non-linearities.

37 Claims, 19 Drawing Sheets

(56) References Cited

U.S. PATENT DOCUMENTS

| | | | | |
|---|---|---|---|---|
| 9,602,121 | B2* | 3/2017 | Ali | H03M 1/361 |
| 9,748,966 | B2 | 8/2017 | Nagarajan et al. | |
| 9,843,337 | B1* | 12/2017 | Li | H03M 1/0673 |
| 2005/0156773 | A1* | 7/2005 | Galton | H03M 1/0673 |
| | | | | 341/144 |
| 2010/0283654 | A1* | 11/2010 | Waheed | G04F 10/005 |
| | | | | 341/166 |
| 2014/0266844 | A1* | 9/2014 | Ali | H03M 1/1071 |
| | | | | 341/155 |
| 2017/0041013 | A1 | 2/2017 | Nagarajan et al. | |

OTHER PUBLICATIONS

Li et al., *Background Calibration Techniques for Multistage Pipelined ADCs with Digital Redundancy*, IEEE Transactions on Circuits and Systems—II: Analog and Digital Signal Proceedings, vol. 50, No. 9, Sep. 2003, 8 pages.

Murmann, *Digitally Assisted Data Converter Design*, 978-1-4799-0645-1/13 © 2013 IEEE, 8 pages.

Setterberg et al., *A 14b 2.5GS/s 8-Way-Interleaved Pipelined ADC with Background Calibration and Digital Dynamic Linearity Correction*, ISSCC 2013 / Session 25 / High Speed Data Converters / 26.3 © 2013 IEEE International Solid-State Circuits Conference, 978-1-4673-4516-3/13, 3 pages.

Galton, *Digital Cancellation of D/A Converter Noise in Pipelined A/D Converters*, IEEE Transactions on Circuits and Systems—II: Analog and Digital Signal Processing, vol. 47, No. 3, Mar. 2000, 12 pages.

\* cited by examiner

BACKGROUND CALIBRATION OF REFERENCE, DAC, AND QUANTIZATION NON-LINEARITY IN ADCS

PRIORITY APPLICATION

This patent application claims priority to and receives benefit from U.S. Provisional Application Ser. No. 62/580,333, titled "BACKGROUND CALIBRATION OF REFERENCE, DAC, AND QUANTIZATION NON-LINEARITY IN ADCS", filed on Nov. 1, 2017, which is hereby incorporated in its entirety.

TECHNICAL FIELD OF THE DISCLOSURE

The present disclosure relates to the field of integrated circuits, in particular to background calibration of analog to digital converters (ADCs).

BACKGROUND

In many electronics applications, an analog to digital converter (ADC) converts an analog input signal to a digital output signal, e.g., for further digital signal processing or storage by digital electronics. Broadly speaking, ADCs can translate analog electrical signals representing real-world phenomenon, e.g., light, sound, temperature, electromagnetic waves, or pressure for data processing purposes. For instance, in measurement systems, a sensor makes measurements and generates an analog signal. The analog signal would then be provided to an ADC as input to generate a digital output signal for further processing. In another instance, a transmitter generates an analog signal using electromagnetic waves to carry information in the air or a transmitter transmits an analog signal to carry information over a cable. The analog signal is then provided as input to an ADC at a receiver to generate a digital output signal, e.g., for further processing by digital electronics.

Due to their wide applicability in many applications, ADCs can be found in places such as broadband communication systems, audio systems, receiver systems, etc. Designing circuitry in ADC is a non-trivial task because each application may have different needs in performance, power, cost, and size. ADCs are used in a broad range of applications including Communications, Energy, Healthcare, Instrumentation and Measurement, Motor and Power Control, Industrial Automation and Aerospace/Defense. As the applications needing ADCs grow, the need for fast yet accurate conversion also grows.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DETAILED DESCRIPTION

Overview

Multi-step analog to digital converters (ADCs) performs multi-step conversion by generating a residue for a subsequent stage to digitize. To generate a residue, a stage in the multi-step ADC would reconstruct the input signal to the stage using a feedforward digital to analog converter (DAC). Non-linearities in the DAC can directly affect the overall performance of the multi-step ADC. To reduce power consumption and complexity of analog circuit design, digital background calibration schemes are implemented to address the non-linearities. The non-linearities that the calibration schemes address can include reference, DAC, and quantization non-linearities.

Multi-Step ADCs as High Speed ADCs

ADCs are electronic devices that convert a continuous physical quantity carried by an analog signal to a digital output or number that represents the quantity's amplitude (or to a digital signal carrying that digital number). An ADC can be defined by the following application requirements: its speed (number of samples per second), its power consumption, its bandwidth (the range of frequencies of analog signals it can properly convert to a digital signal), and its resolution (the number of discrete levels the maximum analog signal can be divided into and represented in the digital signal). An ADC also has various specifications for quantifying ADC dynamic performance, including signal-to-noise-and-distortion ratio SINAD, effective number of bits ENOB, signal to noise ratio SNR, total harmonic distortion THD, total harmonic distortion plus noise THD+N, and spurious free dynamic range SFDR.

ADCs have many different designs, which can be chosen based on the application requirements and specifications. High speed ADCs, typically running at speeds on the order of Giga-samples per second, are particularly important in fields such as communications and instrumentation. The input signal can have a frequency in the giga-Hertz range, and the ADC may need to sample in the range of Giga-samples per second. The circuit not only has to be fast, for some applications, the circuit needs to meet certain performance requirements, such as SNR and SFDR. Designing an ADC that meets speed, performance, area, and power requirements is not trivial, since faster speeds and higher performance often come at the cost of area and power.

Figure 1:
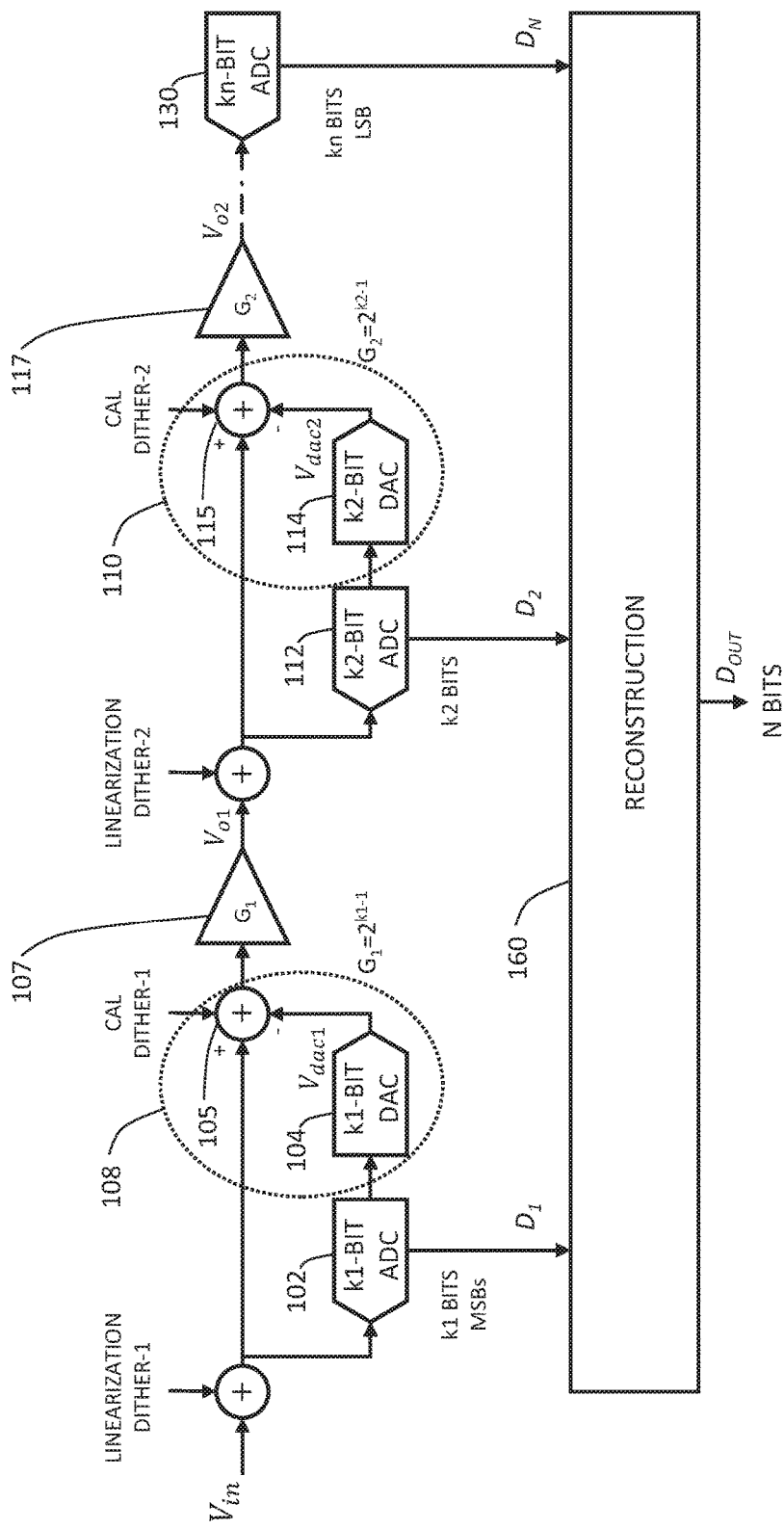
FIG. 1 shows an exemplary pipelined ADC, according to some embodiments of the disclosure.

One commonly-used design for a high speed ADC with good resolution is the multi-step ADC. Multi-step ADCs include pipelined ADCs, pipelined successive-approximation-register (pipelined SAR) ADCs, and sub-ranging ADCs. The principle operation of multi-step ADCs is that the ADC performs conversion in multiple steps. In a series of steps, different portions of the final digital output or a number of bits are resolved in each step, from the most significant bits to the least significant bits. The steps can be performed by one or more stages. The stages are pipelined to achieve high speed conversion. FIG. 1 shows an exemplary pipelined ADC, according to some embodiments of the disclosure. In this example, there are n stages performing n steps respectively. Each step involves coarsely quantizing the input signal to generate a digital output, reconstructing the input signal by a (feedforward) DAC based on the digital output, and obtaining a residue by finding a difference between the input signal and the reconstructed input signal. Examining the first stage of the pipelined ADC, FIG. 1 shows the analog input $V_{in}$ being quantized or digitized by a k1-bit (flash) ADC 102, which generates a digital output $D_1$ having k1 bits. The digital output $D_1$ is then fed forward to k1-bit DAC 104 for reconstructing the analog input $V_{in}$. The DAC outputs $V_{dac1}$ (the reconstructed analog input), from which the residue can be generated. The residue can be found by subtracting the reconstructed analog input $V_{dac1}$ from $V_{in}$ (illustrated by the summation node 105 performing $V_{in}-V_{dac1}$). An amplifier 107 with gain $G_1$ (e.g., where $G_1=2^{k1-1}$) can be applied to the residue to generate the output signal for the stage $V_{o1}$. The output signal can go through a sample and hold circuit (not shown), which can sample and hold the signal for the next stage. The functionalities of the DAC, the summation node, the amplifier, and the sample and hold circuit can be lumped together in a circuit called a multiplying-DAC (MDAC). The output signal $V_{o1}$ (i.e., the amplified residue) is then processed again in a same or similar fashion in the next step or stage. Examining the second stage of the pipelined ADC, $V_{o1}$ can be quantized or digitized by a k2-bit (flash) ADC 112, which generates a digital output $D_2$ having k2 bits. The digital output $D_2$ is then fed forward to k2-bit DAC 114 for reconstructing the amplified residue $V_{o1}$. The DAC outputs $V_{dac2}$ (the reconstructed analog input), from which the residue of the second stage can be generated. The residue of the second stage can be found by subtracting the reconstructed amplified residue $V_{dac2}$ from the amplified residue $V_{o1}$ (illustrated by the summation node 115 performing $V_{o1}-V_{dac2}$). An amplifier 117 with gain $G_2$ (e.g., where $G_2=2^{k2-1}$) can be applied to the residue of the second to generate the output signal for the second stage $V_{o2}$. The last stage of the pipelined ADC, shown as kn-bit (flash) ADC 130, does not generate a residue, and only performs quantization and generates a digital output $D_n$ having kn bits. The digital outputs of the respective stages, $D_1, D_2, \ldots D_n$, generated from the steps can be combined by reconstruction block 160 to generate the final digital output $D_{out}$ having N bits. $D_1$ can correspond to one or more most significant bits (MSBs) of the final digital output, and $D_n$ can correspond to one or more least significant bits (LSBs) of the final digital output.

Impact of the Reference Buffer and DAC on the Performance

Reference buffers and DACs are important building blocks in multi-step ADCs. The reference buffer generates voltage references. The DAC performs appropriate switching to generate an analog output based on a digital input. The reference buffer represents a critical component and a major contributor to the power and distortion of the whole ADC. The accuracy requirement on the reference buffer and the DAC is practically as tight as the accuracy requirement of the whole ADC. If the whole ADC requires 12-bit accuracy, then the reference buffer and the DAC would need to also have 12-bit accuracy, since the reference buffer and the DAC directly affects the residue being generated for the stage.

The incomplete settling of the reference buffer and the DAC can cause distortions that can be hard to fix. Some non-linearities (or distortions) can be due to settling errors in the reference buffer, DAC settling errors, DAC capacitance mismatches, code-dependent errors, input-dependent errors, or non-linear errors in any stage of the ADC. Such non-idealities can cause input-dependent and code-dependent differential non-linearity (DNL) and/or integral non-linearity (INL) jumps or discontinuities in the transfer characteristic at the boundaries of the DAC subranges of the stage. In some cases, these non-idealities can appear in combination with second-order distortion and/or a third-order distortion.

This hard settling requirement on the reference buffer can lead to designs that can consume a relatively large amount of power and take up a large area. This problem is more severe in closed-loop MDACs with shared capacitances, where the capacitances in the MDAC are also used to sample the input signal. The problem is also present in open-loop MDACs. Split-capacitance (split-cap) MDAC architectures can be used to alleviate some of these issues, but it does not eliminate them. Furthermore, split-cap MDAC architectures have a substantial cost on power, noise, and speed. Settling errors of the reference and DAC in split-cap MDACs would still cause significant signal-dependent and code-dependent distortion. Moreover, in open-loop MDACs, split-cap structures suffer similar non-linearity as shared-cap structures. In addition, DAC capacitance mismatches cause code-dependent errors that require foreground/tester calibration to correct. The foreground calibration is done in a condition that is different from the normal operation of the ADC, and hence is susceptible to residual errors that limit the performance. Tester-based calibration results in long test times, which in turn raise the full factory cost of the product.

Because of all of the above and the tight accuracy requirements on the DAC and reference buffer, it is desirable to background calibrate the non-linearities caused by the DAC and reference buffer. Calibrating the DAC and the reference buffer has been traditionally avoided in most calibration algorithms, which have been focused on the MDAC amplifier (a component that has traditionally consumed the most power). Some techniques can calibrate errors in the reference buffer that result in interstage gain errors, but most do not calibrate input-dependent and code-dependent errors, which can be due to incomplete settling and can typically result in DNL/INL jumps super-imposed on a low-order distortion (usually $3^{rd}$ order) of the ADC. One method was proposed to background calibrate DAC errors using the interstage gain error (IGE) dither when random shuffling is employed. However, it required random shuffling (e.g., dynamic element matching) of the DAC capacitances, which causes noise degradation and reduction in sample rate to accommodate the required random switching. It also suffered from high digital complexity and susceptibility to inaccuracies and convergence errors due to the non-idealities in the pipeline, mismatches between the dither and signal paths, and input-dependence.

Calibrating the DAC and reference non-linearities can correct for code-dependent and input-dependent settling errors in the DAC and reference, improves overall performance, enables reducing the power consumption in the reference buffer and the MDAC, and reduces production test time. It also enables the background calibration of DAC capacitance mismatch errors instead of the other less desirable approaches to calibration, which would be done in the foreground or on the tester. The background techniques described herein can eliminate the residual errors that sometimes result from the foreground calibration and reduces the test time. The techniques being described herein correct for both DAC and reference non-linearity in the background and can be employed to calibrate arbitrary quantization non-linear errors that cause DNL/INL jumps in the transfer characteristic of the ADC. These techniques are different from the calibration of the MDAC amplifier gain and non-linearity, which usually manifest themselves as inter-stage errors.

Dither Injection

The techniques described herein can calibrate the DAC and reference non-linear errors using the dither injected on the input. This dither can be injected in ADCs for linearization purposes (i.e., dithering and spreading the distortion spurs in the noise floor) and to improve the performance of some calibrations. This linearization dither is often called the "large dither" to distinguish it from the calibration dithers (referred herein as "Cal Dither") used for the IGE or interstage memory error (IME) calibrations. Linearization dithers are often injected in both the MDAC and the (flash) ADC of a stage, do not consume any portion of the dynamic range, and get subtracted in the digital domain. It is important to note that the Cal Dither injected in the MDAC to calibrate the amplifier gain error and non-linearity could not be used directly to calibrate the DAC and reference buffer non-linearity, because the Cal Dither is injected in the MDAC only during the hold phase, and therefore does not "see" the same transfer characteristic encountered by the input signal.

Referring back to FIG. 1, illustrating a pipelined ADC, the linearization dither, e.g., "Linearization Dither-1" and "Linearization Dither-2" can be injected in the first stage and the second stage at the respective inputs of the stages. "Linearization Dither-1" can be used to calibrate the circuits in circle 108. "Linearization Dither-2" can be used to calibrate the circuits in circle 110. The linearization dithers can "see" the DAC error, whereas the Cal Dithers cannot.

Figure 2:
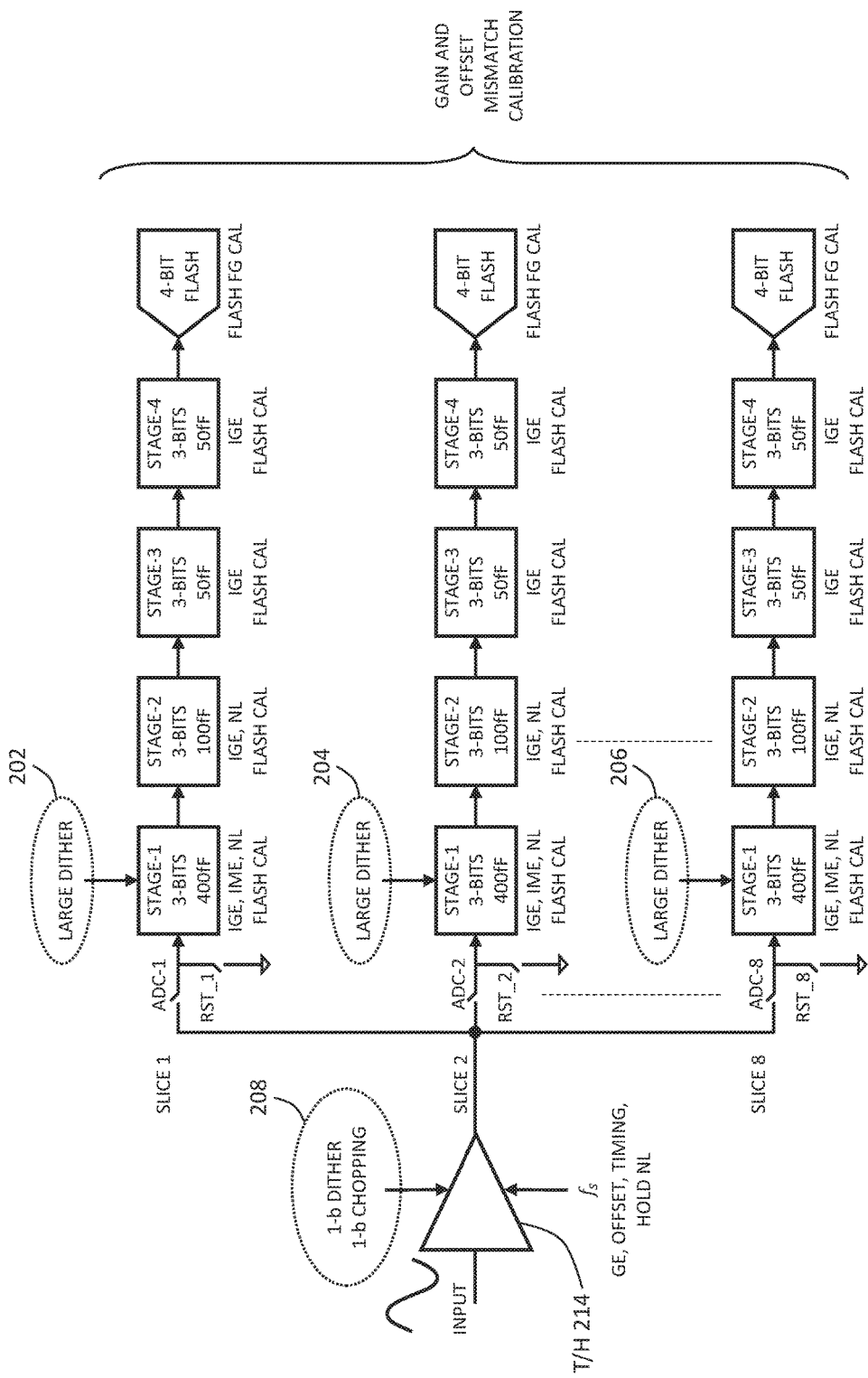
FIG. 2 shows an exemplary time-interleaved ADC, according to some embodiments of the disclosure.

FIG. 2 shows an exemplary time-interleaved ADC, according to some embodiments of the disclosure. The time-interleaved ADC has a (single) track and hold (T/H) circuit 214 receiving an analog input, and 8 ADC slices (shown as Slice 1, Slice 2, . . . Slice 8) which can convert the held input from the T/H circuit 214 in a time-interleaved manner. The ADC slices can operate in a sequential or randomized time-interleaved manner. Large dither 202, large dither 204, and large dither 206, can be injected in the MDAC and (flash) ADC of stage-1 of the ADC slices (in a manner as illustrated by the linearization dithers seen in FIG. 1). Also, a dither 208 can be injected in the T/H circuit 214. Dither 208 can be used to calibrate reference non-linearity in the first stage of each ADC slice following the T/H circuit 214. Dither 208 can also be used to calibrate other sources of discrete-time non-linearity in each ADC slice. Accordingly, large dither 202, large dither 204, large dither 206, and dither 208, can be used to calibrate DAC and reference buffer non-linearity of the stage-1 of the ADC slices.

Figure 3:
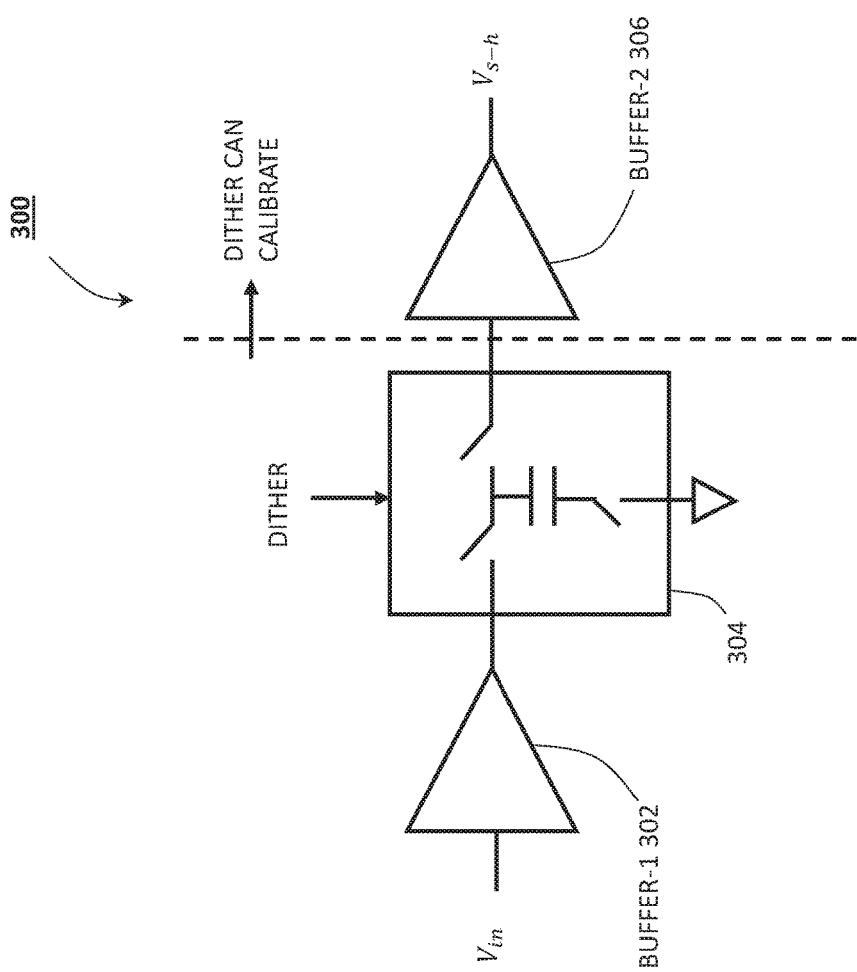
FIG. 3 shows dither injection in a track and hold circuit according to some embodiments of the disclosure.

FIG. 3 shows dither injection in a T/H circuit 300 according to some embodiments of the disclosure. T/H circuit 300 can represent one possible implementation of the T/H circuit 214 seen in FIGURE. T/H circuit 300 has two buffers, Buffer-1 302, and Buffer-2 306 and a switched-capacitor network 304 in between the two buffers, according to some embodiments of the disclosure. Dither can be injected in the switched-capacitor network 304. Such dither can be used for the calibration schemes described herein to address DAC and reference non-linearities of the first stage of a multi-step ADC. The Buffer-1 302 ("sample buffer") receives the (voltage) input $V_{in}$, and buffers the input. The buffered input can be sampled on the switched-capacitor network 304 ("sampling network"). For instance, the switched-capacitor network 304 can sample the buffered input onto capacitor using suitable switches. The buffer-2 306 ("hold buffer") can buffer the sampled input and provided the held signal $V_{s-h}$ to an ADC (not shown in FIG. 3). A dither can be injected in the switched-capacitor network with a capacitor.

Figure 4:
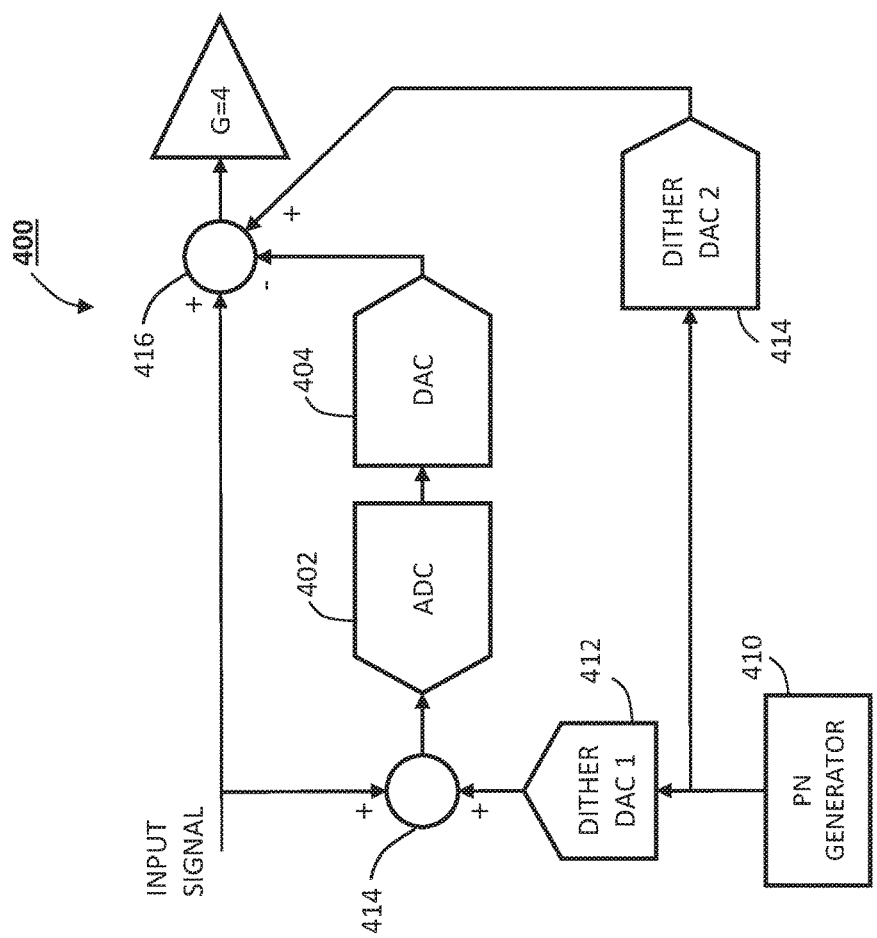
FIG. 4 shows dither injection in both the multiplying digital to analog converter (MDAC) and the (flash) ADC of a stage, according to some embodiments of the disclosure.

FIG. 4 shows dither injection in both the MDAC and the (flash) ADC of a stage, according to some embodiments of the disclosure. Specifically, FIG. 4 illustrates a stage 400 with a (flash) ADC 402 and a feedforward DAC 404, and a large dither is injected in both the MDAC and the flash ADC. A pseudo-number (PN) generator 410 can provide a digital dither code, e.g., a pseudo-random code, to be injected. An analog dither can be generated by dither DAC 1 412 based on the digital dither code and injected to the (flash) ADC 402. As shown, the dither DAC 1 412 injects the analog dither to the input signal at the input of ADC 402 through a summation node 414, and adds the analog dither to the input signal before the signal is quantized by ADC 402. The analog dither can be used to calibrate non-linearities in the reference buffer and DAC 404 of this stage. A further analog dither can be generated by dither DAC 2 414 based on the digital dither code and injected in the MDAC (e.g., at the summation node 416 generating the residue for the stage). This dither had been used only for dithering (spreading) residual errors in the noise floor. For the calibrations described herein, this same dither used for dithering can be used for calibration of non-linearities, and an additional dither is not needed.

When analog dither is added at the input of the ADC 402 and added in the MDAC, the dither being added is as if it was injected at the input of the stage. This dither would "see" the non-linearities in the reference buffer and DAC 404 of this stage.

In practice, the calibrations would need just one level of this pre-existing "large" dither (if the "large" dither is a multi-level dither) to expose the DAC and reference non-linearities that are being calibrated.

Figure 5:
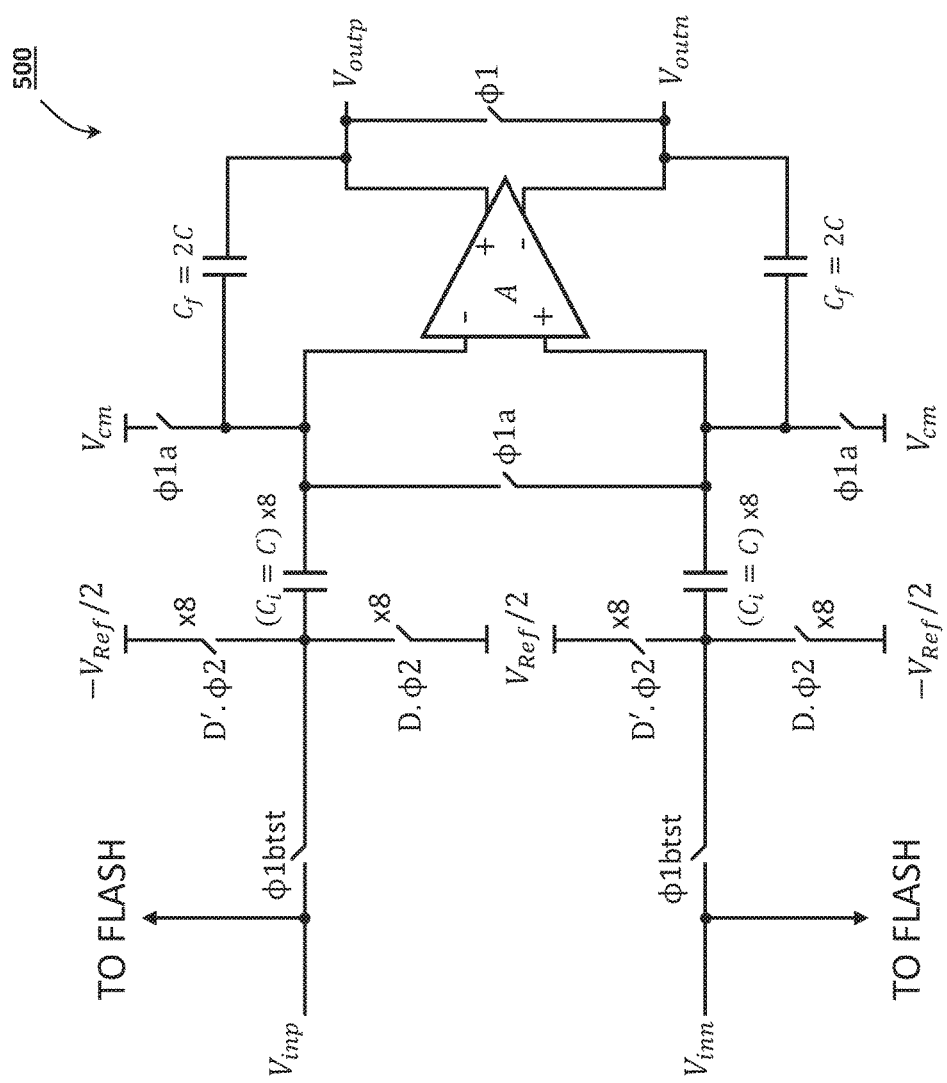
FIG. 5 shows a closed-loop shared-capacitance MDAC.
Figure 6:
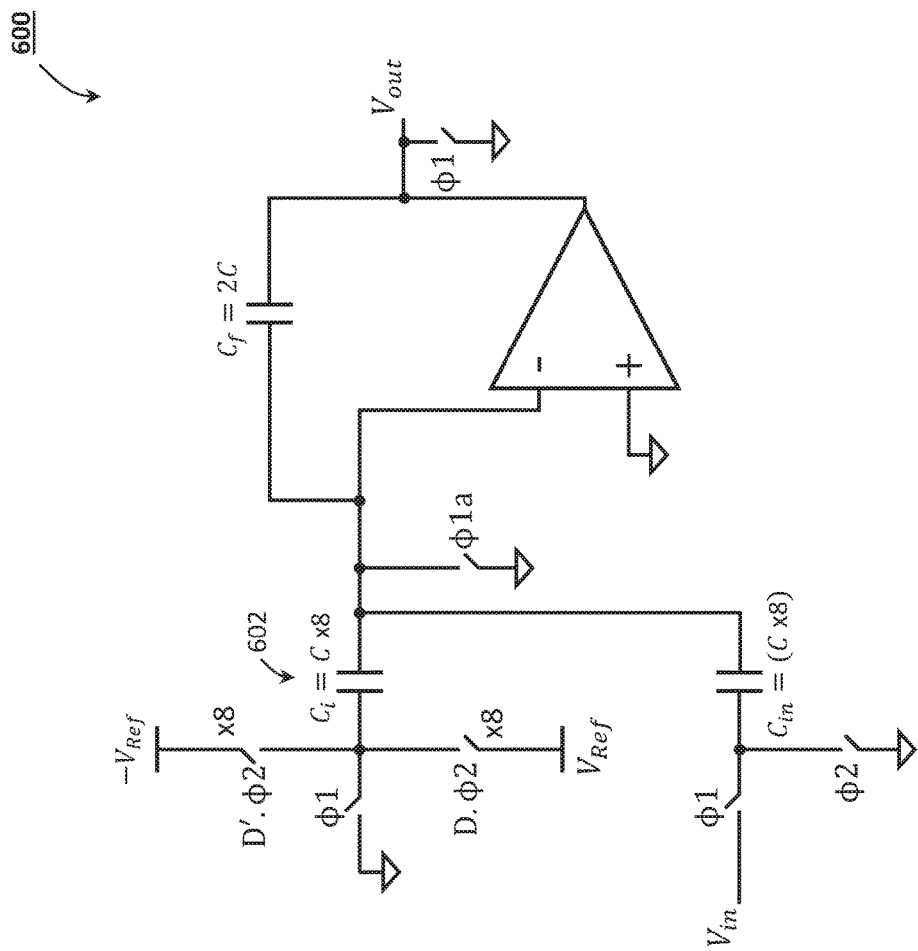
FIG. 6 shows a schematic of a closed-loop split-capacitance MDAC in single-ended form for simplicity.
Figure 7:
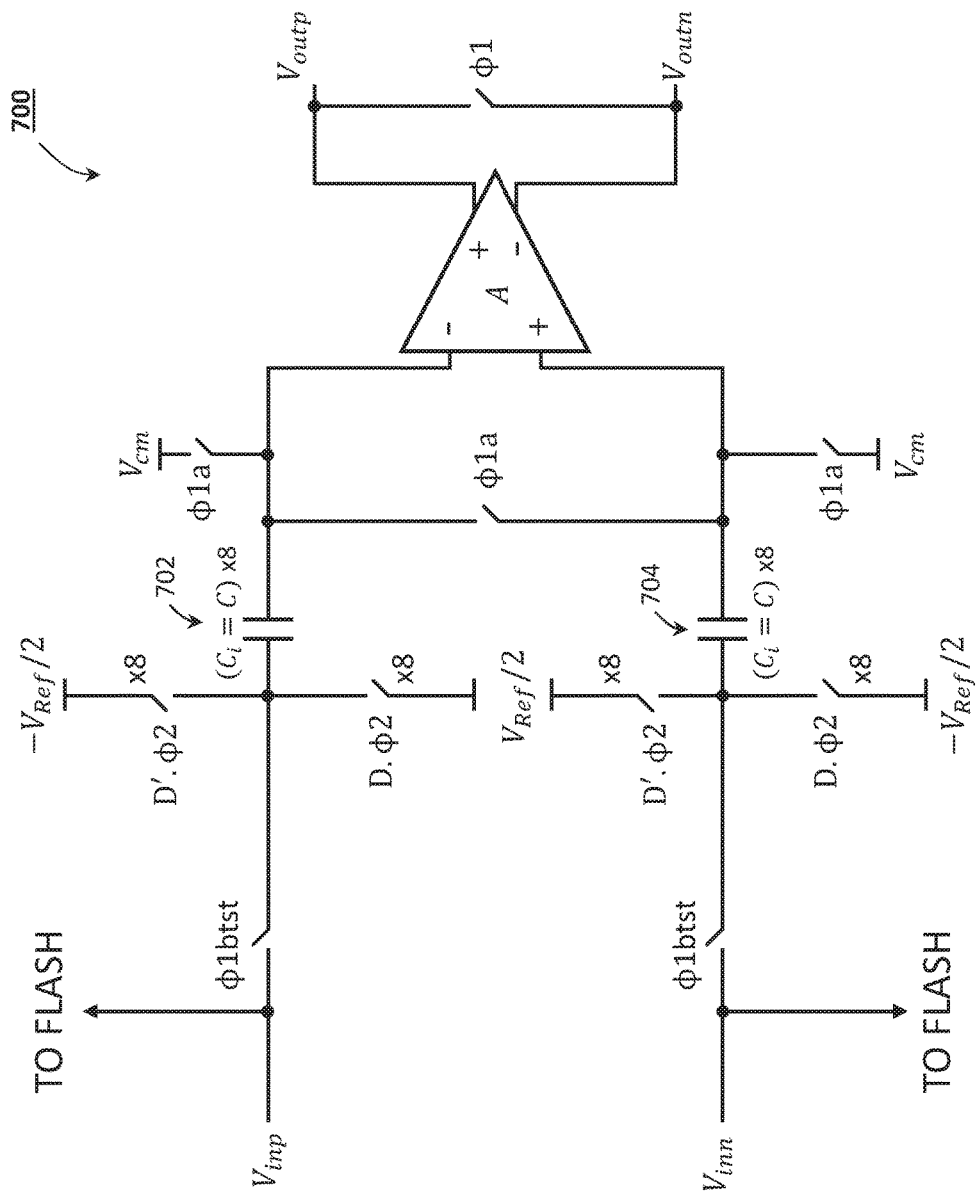
FIG. 7 shows an open-loop shared-capacitance MDAC.

To illustrate how to implement dither injection, FIGS. 5-7 show various implementations for the MDAC. As discussed before, the MDAC represents a circuit that performs a collection of functions in a stage of the multi-step ADC. Part of the MDAC is a DAC, and in the illustrations, the DAC is a 3-bit capacitive DAC with 8 capacitors. FIG. 5 shows a closed-loop shared-capacitance MDAC 500 implemented as a differential circuit. The MDAC 500 uses shared-capacitance (where the capacitances in the MDAC are also used to sample the input signal) and has a closed-loop amplifier. FIG. 6 shows a schematic of a closed-loop split-cap MDAC 600 in single-ended form for simplicity. FIG. 7 shows an open-loop MDAC shared-capacitance MDAC 700.

Figure 8:
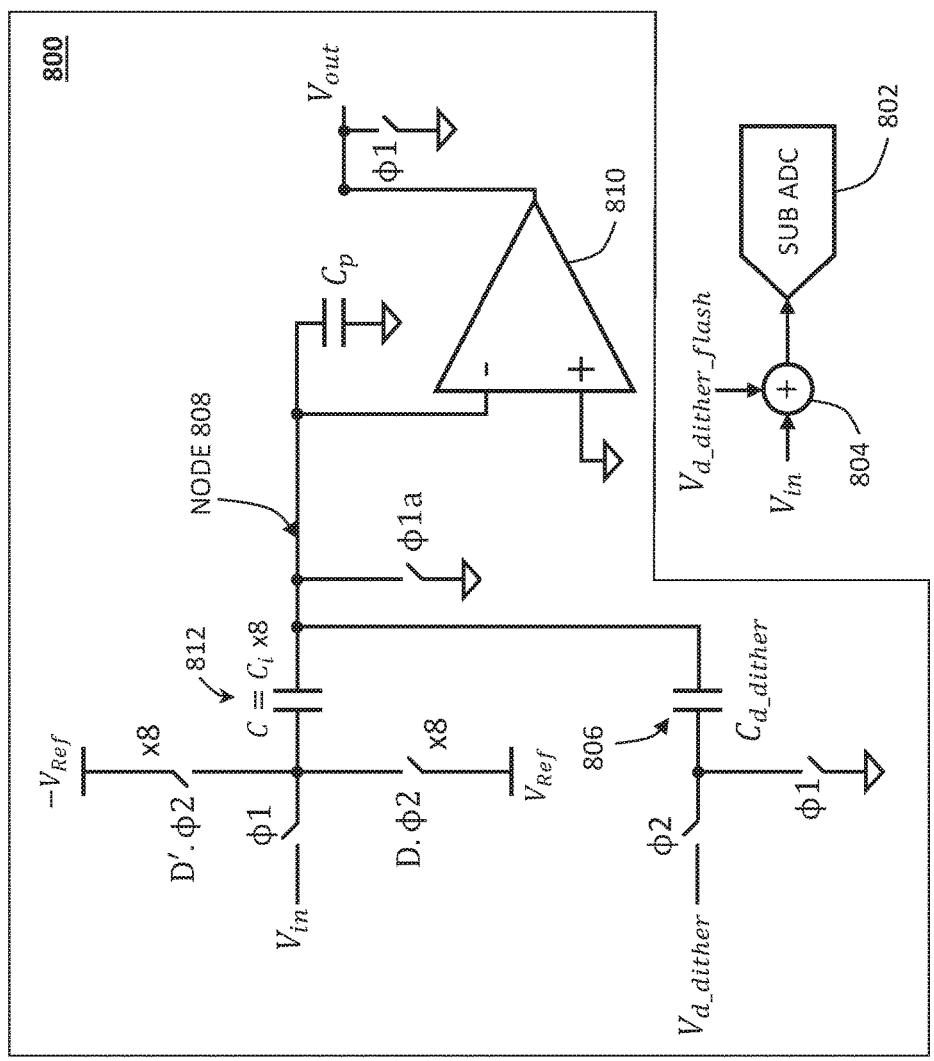
FIG. 8 shows large (e.g., linearization) dither injection in an MDAC and a (flash) ADC, according to some embodiments of the disclosure.

To implement dither injection as previously shown in FIG. 4, FIG. 8 shows large (e.g., linearization) dither injection in an open-loop MDAC 800 and a (flash) ADC 802 (shown as "Sub-ADC"), according to some embodiments of the disclosure. $V_{d\_dither}$ is injected into the MDAC 800 using capacitor 806 labeled $C_{d\_dither}$, where capacitor 806 is in parallel to the C capacitances 812. $V_{d\_dither}$ can originate from a PN generator and dither DAC (e.g., PN generator 410 and dither DAC 2 414 of FIG. 2). During phase φ2, $C_{d\_dither}$ can inject a dither based on $V_{d\_dither}$ to the signal at node 808 (e.g., the inverting input of the operational amplifier 810 held at virtual ground). $V_{d\_dither\_flash}$ is injected in the (flash) ADC 802 by adding $V_{d\_dither\_flash}$ to $V_{in}$ using a summation node 804 at the input of the ADC 802. $V_{d\_dither\_flash}$ can originate from a PN generator and dither DAC (e.g., PN generator 410 and dither DAC 1 412 of FIG. 2).

If the dither is injected in both the MDAC and the flash, it is as if the dither was injected at the input of the stage. Therefore, it can be used to calibrate the DAC and reference buffer errors of the stage itself. If the dither is injected in the MDAC only, it can be used to calibrate the DAC errors of the following stage.

The disclosure envisions that that the technique for large dither injection seen in FIG. 8 can be applied to FIGS. 5-7 as well.

For FIG. 5, a first capacitor can be added in parallel to the $C_i$ capacitances 502 in the positive side of the differential circuit, and a second capacitor can be added in parallel to the $C_i$ capacitances 504 in the negative side of the differential circuit. The first capacitor can inject a dither based on $V_{d\_dither}$ on the positive side of the differential circuit, and the second capacitor can inject a dither based on $V_{d\_dither\_bar}$ on the negative side of the differential circuit. $V_{d\_dither\_bar}$ is complementary to/inverse of $V_{d\_dither}$. For instance, if $V_{d\_dither}=+V_{ref}$, then $V_{d\_dither\_bar}=-V_{ref}$. If desired, $V_{d\_dither\_flash}$ can likewise be injected in the (flash) ADC of the stage (not shown) by adding $V_{d\_dither\_flash}$ to $V_{in}$ using a summation node at the input of the ADC.

For FIG. 6, a capacitor can be added in parallel to the $C_i$ capacitances 602. The capacitor can inject a dither based on $V_{d\_dither}$. If desired, $V_{d\_dither\_flash}$ can likewise be injected in the (flash) ADC of the stage (not shown) by adding $V_{d\_dither\_flash}$ to $V_{in}$ using a summation node at the input of the ADC.

For FIG. 7, a first capacitor can be added in parallel to the $C_i$ capacitances 702 in the positive side of the differential circuit, and a second capacitor can be added in parallel to the $C_i$ capacitances 704 in the negative side of the differential circuit. The first capacitor can inject a dither based on $V_{d\_dither}$ on the positive side of the differential circuit, and the second capacitor can inject a dither based on $V_{d\_dither\_bar}$ on the negative side of the differential circuit. $V_{d\_dither\_bar}$ is complementary to/inverse of $V_{d\_dither}$. For instance, if $V_{d\_dither}=+V_{ref}$, then $V_{d\_dither\_bar}=-V_{ref}$. If desired, $V_{d\_dither\_flash}$ can likewise be injected in the (flash) ADC of the stage (not shown) by adding $V_{d\_dither\_flash}$ to $V_{in}$ using a summation node at the input of the ADC.

Besides injecting a dither in both the MDAC and the flash, a dither injected on the input or in a previous stage can also be used for the calibration schemes described herein. For instance, a dither injected in the MDAC only in stage-1 may not be effective in correcting DAC/reference errors of stage-1, it can be used to detect DAC/reference errors in stage-2.

To calibrate the DAC/reference errors, three options for dithering are available: inject dither in the MDAC and the flash of a stage, inject dither in the MDAC only in a previous stage, and inject dither in a T/H circuit before the stage.

Calibration of DAC Non-Linear Errors

DAC errors can be caused by code-dependent reference settling errors, code-dependent (flash) ADC propagation delays, DAC capacitance mismatches, etc. Any non-linearity in the DAC appears as-is at the output residue. Accordingly, the accuracy requirements on the DAC and the reference are as tight as the whole ADC's accuracy. The following discussions are focused on these errors in the first stage of the multi-step ADC. Extending the examples to address errors in other subsequent stage(s) of the multi-step ADC is possible, details of which are discussed later in the disclosure.

Figure 9:
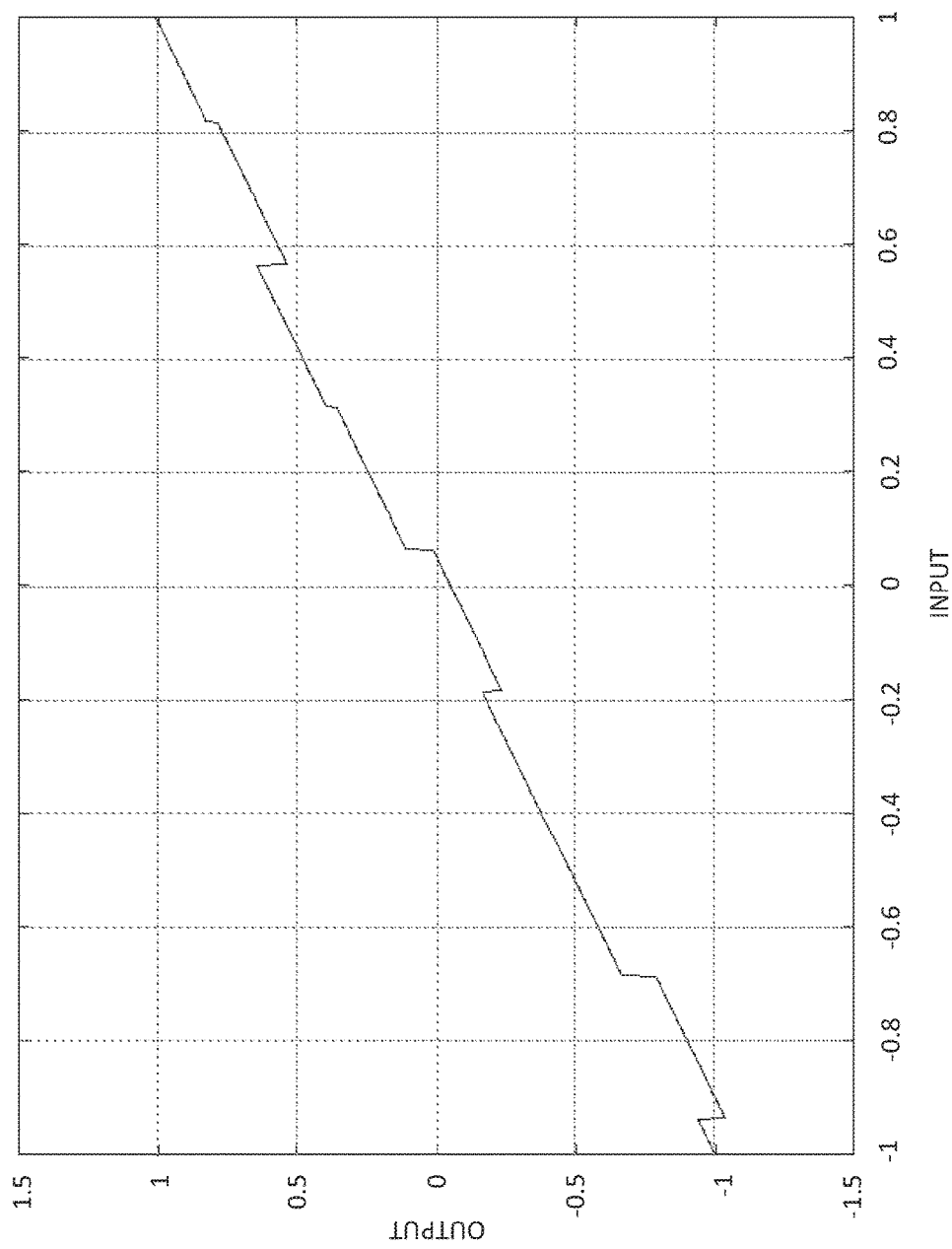
FIG. 9 shows ADC transfer characteristic in the presence of digital to analog converter (DAC) errors.

FIG. 9 shows ADC transfer characteristic in the presence of DAC errors. The errors mentioned can result in jumps in the transfer characteristic, where subranges become dislocated relative to each other. Subranges are ranges of the DAC (dividing up the whole range of the DAC), and the subranges correspond to different input codes to the DAC. The errors are also manifested at the output of the ADC in a code-dependent manner, which can make it more difficult to extract. Depending on the code generated by the (flash) ADC, the error in the DAC may differ. The errors are not uniform or regular across the subranges, and can vary from one subrange to another (e.g., shifting the transfer characteristic up and down). As a result, the transfer characteristic of the ADC is irregular. Ideally, the transfer characteristic is a straight line.

Unfortunately, large dither does not dither these DAC errors effectively. For some fixed errors, some schemes are available to correct those errors in the foreground or with a tester. However, for code-dependent DAC errors, foreground schemes may be insufficient since the DAC errors can be sensitive to the input distribution. With the amplifier power being reduced significantly (e.g., using simpler or open-loop amplifiers), DAC errors can become more significant. These errors can also differ depending on conditions such as sample range, temperature, etc. It would be preferable to extract the DAC errors in the background.

To background calibrate these errors, the (existing) large dither can used to expose those errors, where the errors can be exposed without being dependent on the input distribution. For instance, the large dither can correspond to a dither injected in the T/H circuit preceding the first stage of the multi-step ADC. In another instance, the large dither can correspond to the dither injected at the input of the flash ADC and in the MDAC, as illustrated by FIGS. 4 and 8. By adding $+V_{d\_lg}$ or $-V_{d\_lg}$ (where $V_{d\_lg}$ is the nominal value of the dither, e.g., equating to one bit) on the analog side, then subtracting an estimate of that dither on the digital side, the resulting digital signal (after subtracting the dither estimate) can effectively expose the DNL/INL jumps. When extracting errors for a first stage of the multi-step ADC, the input signal to the first stage is the signal of interest in the calculations. Moreover, the dither injected in the T/H circuit preceding the first stage, or the dither injected in front of the flash ADC and in the MDAC can be used as the dither signal that can expose the errors in the first stage. Since the error extraction scheme happens in the digital domain, a sample of the input signal to the first stage is used in the calculations. The sample if the input signal to the first stage can be easily obtained since the multi-step ADC digitizes the input signal to the first stage to generate a final digital output signal (e.g., $D_{OUT}$ of FIG. 1), where the final digital output signal is reconstructed from the outputs from all the stages of the multi-step ADC. The following passages, describing the calibrations of the first stage, refer to "the signal", "the output", "the output signal", "the output of the ADC" or $V_{out}[n]$, which all correspond to a sample of the input signal to the first stage (i.e., the signal of interest). The "dither", or "linearization dither" correspond to the dither that can be used to expose the errors in the first stage.

The addition of the dither combined with a DNL/INL jump can cause the signal to experience a different transfer characteristic depending on whether the dither is positive or negative, since the dither can cause the signal to cross (or not cross) the jump, depending on the polarity of the dither. Phrased differently, the calibration scheme observes what happens to the linearization dither as the dither goes through the transfer characteristic. The dither randomly moves between $+V_{d\_lg}$ or $-V_{d\_lg}$. When the dither is positive, the signal moves to one subrange. When the dither is negative, the digital output signal moves to another subrange. As a result, the dither forces the signal to cross a jump between subranges. When there is a jump, there would be a difference in the signal that depends on the dither. If there is no jump, the dither being positive or negative would not make a difference in the signal. Since the dither value is known, it is possible to collect information in the background and determine if there is a jump. If there is a jump, then the calibration scheme can minimize the jump.

Figure 10:
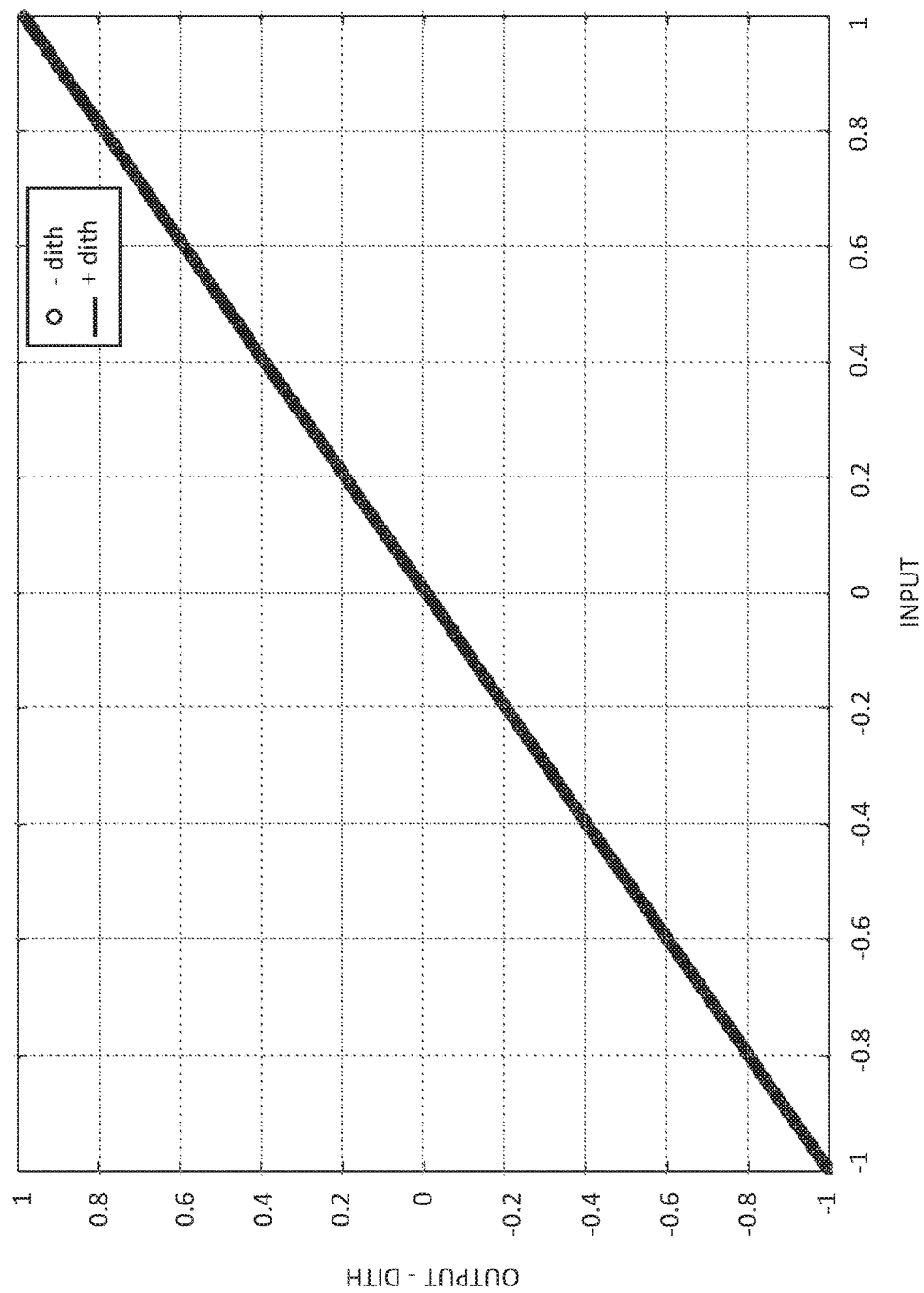
FIG. 10 shows the transfer characteristic after dither subtraction for an ideal ADC.
Figure 11:
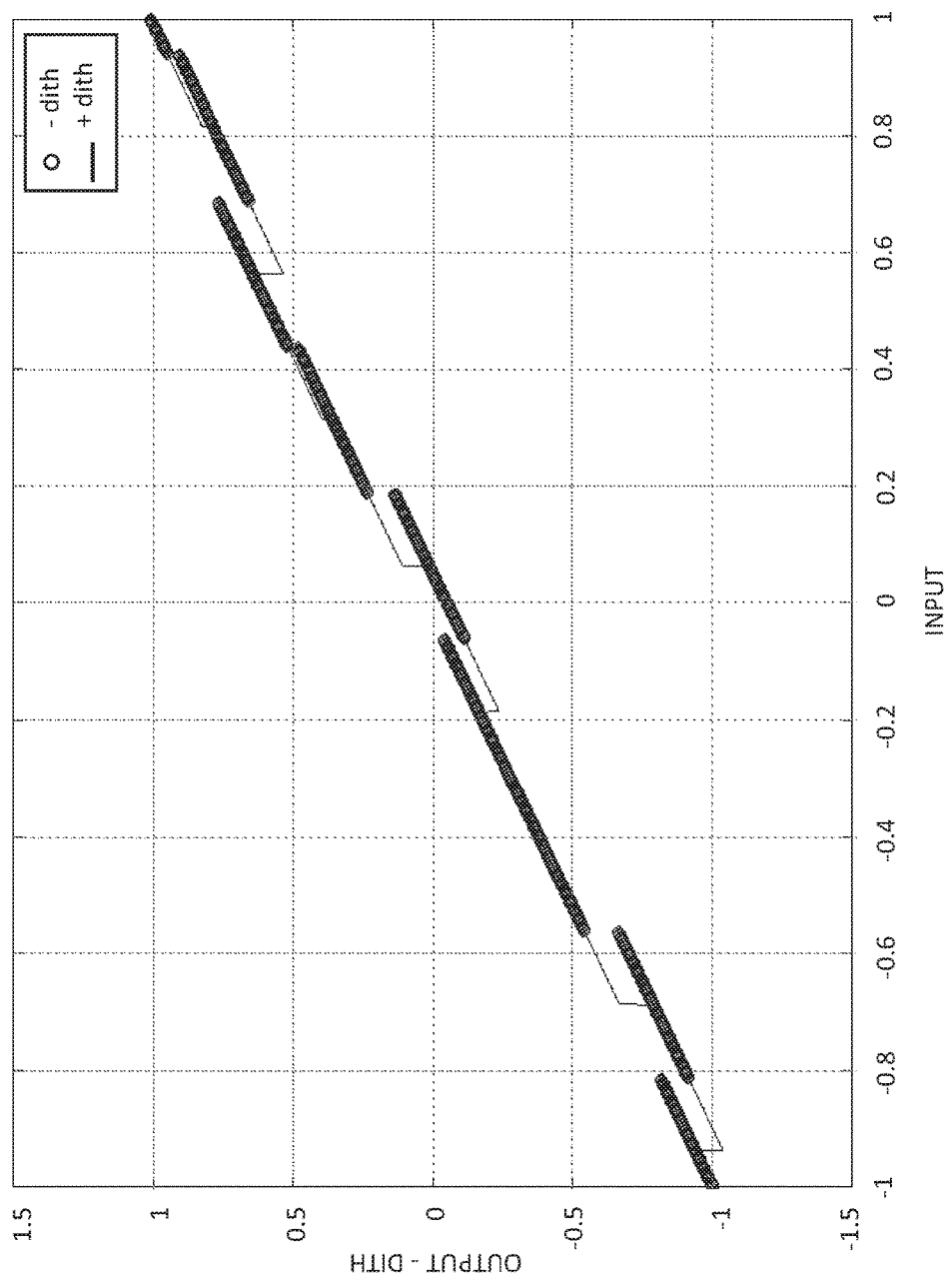
FIG. 11 shows the transfer characteristic after dither subtraction for an ADC with DAC errors in the first stage.

To illustrate, FIGS. 10 and 11 show the transfer characteristics after dither subtraction for an ideal ADC and for an ADC with DAC errors in the first stage, respectively. The x-axis shows the input to the ADC, and the y-axis shows the output of the ADC with the dither removed ("output-dith"). Data for samples of the output of the ADC with the dither signal being positive (+dith) shows up as a thin line and data for samples with the dither signal being negative (−dith) shows up as a thick line. For the ideal ADC, the output of the ADC is the same no matter what the dither polarity is, as seen in FIG. 10. For the ADC with DAC errors, the output of the ADC differs depending on the dither signal being positive (+dith) or negative (−dith), as seen in FIG. 11. The two plots for +dith and −dith in FIG. 11 do not line up like they do in FIG. 10.

To detect these differences for the first stage of the ADC, or measure the jump, histogram/counting can be used with the large dither injected in the stage or an input dither injected in the T/H circuit. The presence of the dither helps expose the non-linearities in the first stage of the ADC due to the DAC errors, where it is possible to observe differences in the transfer characteristics between the case when the dither is positive and the case when the dither is negative. This difference in the transfer characteristics results in differences in the counts (or another suitable measurement) at the same output (code) and independent of the input signal distribution. Using the difference in counts at the same output (code) between two neighboring subranges for the two dither polarities as a measure of the jump between the two subranges, the adaptive algorithm can minimize the jump by iteratively reducing the count difference.

Unlike some second harmonic (HD2) and third harmonic (HD3) calibrations, the background calibration scheme selects inspection points. The comparison between the two dither polarities, such as the difference in counts, are done at the inspection points. The challenge to finding the inspection point is that the input is not known. Only the output of the ADC and the dither are known. Inspection points are selected with specific requirements to ensure the DAC error can be properly extracted. The inspection points are selected at output values where two different and neighboring flash codes (i.e., subranges) are exercised for the same output (code) and the two dither polarities, after estimates of the dither have been subtracted.

One consideration being taken into account when finding inspection points is to find overlaps. The scheme looks for the case, for the same output minus the dither estimate, where the two flash codes were different. Phrased differently, the "output" is the same in both scenarios (i.e., for both the positive dither and negative dither), but the same output is obtained using two different flash codes. If the DAC has an error, a measurable jump or difference between the two dither polarities would be present at the inspection point. If the DAC doesn't have an error, no measurable jump or difference would be present at the inspection point. In the examples shown, the DAC is a 3-bit DAC, and so there are 9 codes. For a 3-bit DAC, there would be 8 inspection points, defined between each pair of neighboring subranges or flash codes.

For example, the first inspection point $V_{insp1}$ aims to measure the jump between the first and second subranges (subrange:1 and subrange:2). Accordingly, first inspection point $V_{insp1}$ needs to cross the first two subranges of the stage, such that:

$$V_{insp1} \in \left\{\left\{(V_{out}[n] - GV_{d\_lg}[n])\,|_{V_{d\_lg}<0 \text{ AND } flash=subrange:1}\right\} \cap \right. \quad (1)$$
$$\left.\left\{(V_{out}[n] - GV_{d\_lg}[n])\,|_{V_{d\_lg}>0 \text{ AND } flash=subrange:2}\right\}\right\}$$

$V_{out}[n]$ is the output (i.e., the ADC digital output representing a sample of the input to the first stage of the ADC), G is the gain estimate of the large dither that can be obtained independently using a suitable gain estimation methods, and $V_{d\_lg}$ is the ideal amplitude of the large dither. $GV_{d\_lg}[n]$ is thus a dither estimate. That is, the first inspection point $V_{insp1}$ can be any output point (or code) that lies at the intersection of the two sets given above. The first set is the set of outputs with the dither estimate subtracted when the dither is negative and when the DAC is in the first subrange (flash code=subrange:1). The second set is the set of outputs with the dither estimate subtracted when the dither is positive and when the DAC of the first stage is in the second subrange (flash code=subrange:2).

If there is no intersection between these two sets, the inspection point can be chosen as the minimum point in the second set, or the maximum point in the first set. That is:

$$V_{insp1} = \left\{(V_{out}[n] - GV_{d\_lg}[n])\,|_{V_{d\_lg}<0 \text{ AND } flash=subrange:1}\right\} \quad (2)$$
$$\text{OR: } V_{insp1} = \min\left\{(V_{out}[n] - GV_{d\_lg}[n])\,|_{V_{d\_lg}<0 \text{ AND } flash=subrange:2}\right\}$$

Similarly, to detect the jump between subrange:2 and subrange:3, the second inspection point $V_{insp2}$ needs to cross the subrange:2 and subrange:3, such that:

$$V_{insp2} \in \left\{\left\{(V_{out}[n] - GV_{d\_lg}[n])\,|_{V_{d\_lg}<0 \text{ AND } flash=subrange:2}\right\} \cap \right. \quad (3)$$
$$\left.\left\{(V_{out}[n] - GV_{d\_lg}[n])\,|_{V_{d\_lg}>0 \text{ AND } flash=subrange:3}\right\}\right\}$$

The kth inspection point $V_{inspk}$ can be determined as follows:

$$V_{inspk} \in \left\{ \left\{ (V_{out}[n] - GV_{d\_lg}[n]) \Big|_{V_{d\_lg}<0 \text{ AND } flash=subrange:k} \right\} \cap \right.$$
$$\left. \left\{ (V_{out}[n] - GV_{d\_lg}[n]) \Big|_{V_{d\_lg}>0 \text{ AND } flash=subrange:(k+1)} \right\} \right\} \quad (4)$$

The choice of these inspection points is performed by the algorithm using the stage-1 flash codes (corresponds to "subrange") and the output (code) of the ADC after subtracting the dither estimates (corresponds to "output-dith"). The inspection points are thus determined based on samples of the input signal to the first stage (i.e., the output of the ADC), the dither polarity ($V_{d\_lg}<0$ or $V_{d\_lg}>0$), and the output code of (the ADC in) the first stage (i.e., the subrange).

The errors that represent the DAC jumps are calculated at the different inspection points as follows. For example, the error representing the jump at the first inspection point, $\varepsilon(V_{insp1})$ can be defined as follows:

$$\varepsilon(V_{insp1}) = Cumsumn_{V_{insp1}}(V_{out}[n] - GV_{d\_lg}[n]) \Big|_{V_{d\_lg}>0}$$
$$- Cumsumn_{V_{insp1}}(V_{out}[n] - GV_{d\_lg}[n]) \Big|_{V_{d\_lg}<0} \quad (5)$$

$Cumsumn_{V_{insp1}}(x)|y$ is the cumulative count of all the points of amplitude×less than or equal to $V_{insp1}$ that satisfy the conditions listed in y. Accordingly, $$Cumsumn_{V_{insp1}}(V_{out}[n] - GV_{d\_lg}[n]) \Big|_{V_{d\_lg}>0}$$

is the cumulative count (or number) of all points where the output with the dither estimate subtracted $V_{out}[n]-GV_{d\_lg}[n]$ is less than or equal to the first inspection point $V_{insp1}$ when the dither is positive $V_{d\_lg}>0$.

$$Cumsumn_{V_{insp1}}(V_{out}[n] - GV_{d\_lg}[n]) \Big|_{V_{d\_lg}<0}$$

is the cumulative count (or number) of all points where the output with the dither estimate subtracted $V_{out}[n]-GV_{d\_lg}[n]$ is less than or equal to the first inspection point $V_{insp1}$ when the dither is negative $V_{d\_lg}<0$. The error finds the difference in the cumulative counts for the two dither polarities at the inspection point, i.e., the error compares the count of the samples/points of the output with the dither estimate subtracted up to the inspection point between the two dither polarities.

The shift in the subrange (e.g., a shift to be used for correcting the error in the subrange or minimizing the jump between the subranges) is defined by the correction parameter $\alpha_{sub1}$, which iteratively converges to the right value (e.g., with the least means squared (LMS) update equation) that eliminates the jumps starting with the left-most subrange, such that:

$$\alpha_{sub1}(n+1) = \alpha_{sub1}(n) + \mu \times \varepsilon(V_{insp1}) \quad (6)$$

Similarly, for the jump between the second and third subranges at the second inspection point $V_{insp2}$:

$$\varepsilon(V_{insp2}) = Cumsumn_{V_{insp2}}(V_{out}[n] - GV_{d\_lg}[n]) \Big|_{V_{d\_lg}>0}$$
$$- Cumsumn_{V_{insp2}}(V_{out}[n] - GV_{d\_lg}[n]) \Big|_{V_{d\_lg}<0} \quad (7)$$

And the correction parameter is given by:

$$\alpha_{sub2}(n+1) = \alpha_{sub2}(n) + \mu \times \varepsilon(V_{insp2}) \quad (8)$$

The DAC correction is performed using code-dependent shifts on the (corrected) ADC output $v_{out_{cal}}$ (the digital output which represents the input to the first stage), such that:

$$v_{out_{cal}} = v_{out} - \alpha_{sub1} \cdot (fl=sub_2) - \alpha_{sub2} \cdot (fl=sub_3) - \ldots - \alpha_{sub(k-1)} \cdot (fl=sub_k) \quad (9)$$

k is the number of subranges of the stage. The operation ($fl=sub_i$) is a logical operation that returns 1 if the flash code indicates the ith subrange, and 0 otherwise. The equation selects the correction parameter based on the output code of the stage (or subrange), and applies the selected correction parameter to the output of the ADC (i.e., the digital output representing the input signal to the first stage). The calibrated output is used back in equations (1) to (7) as the $V_{out}[n]$ above to re-calculate the inspection points and errors.

Referring back to equations (5) and (7) above, counting over open intervals is not necessary, and that closed intervals could work as well, as long as the interval includes the DAC jump. There can be multiple ways to count the samples that would expose these jumps.

In another embodiment, it is possible to use the amplitudes and correlations instead of counts to detect the jumps (discontinuities). In this case, the scheme can locate the inspection points as described above, e.g., in equations (1) to (4), then the scheme apply the correlation equation for the points below the inspection points as follows:

For $V_{out}[n]-GV_{d\_lg}[n]<V_{insp1}$, the error can be obtained with correlation, and the correction parameter can be updated by the LMS equation:

$$\alpha_{sub1}(n+1) = \alpha_{sub1}(n) + \mu \times V_{d\_lg}*(V_{out}[n] - GV_{d\_lg}[n])_{<V_{insp1}} \quad (10)$$

In other words, the error for first inspection point $\varepsilon(V_{insp1})$ is defined as $V_{d\_lg}*(V_{out}[n]-GV_{d\_lg}[n])|_{<V_{insp1}}$, which is the correlation of the dither values $V_{d\_lg}$ and samples/points of the output with the dither estimate subtracted $V_{out}[n]-GV_{d\_lg}[n]$ below the first inspection point $V_{insp1}$. Correlation can be performed based on a suitable statistical correlation method that can access the similarity of two data sets and outputs the similarity as a correlation coefficient. Accordingly, the result of the correlation can be a measure for comparing between the two dither polarities at the inspection point.

For $V_{out}[n]-GV_{d\_lg}[n]<V_{insp2}:\alpha_{sub2}(n+1)=\alpha_{sub2}(n)+\mu \times V_{d\_lg}*(V_{out}[n]-GV_{d\_lg}[n])|_{<V_{insp2}}$ (11)

The DAC correction is performed using code-dependent shifts (the correction depends on the code, or the correction parameter is selected based on the output code of the first stage) on the (corrected) ADC output $v_{out_{cal}}$ (i.e., the digital output representing the input signal to the first stage), such that:

$$v_{out_{cal}} = v_{out} - \alpha_{sub1}(fl=sub_2) - \alpha_{sub2} \cdot (fl=sub_3) - \ldots - \alpha_{sub(k-1)} \cdot (fl=sub_k) \quad (12)$$

The correlation approach described above in equations (10) to (11) is more computationally expensive than the counting technique described above in equations (5) to (8). However, both methods can be used for detecting the jump between subranges caused by DAC errors. Generally the counting method is preferred, since it is less computationally expensive to implement and can save in power consumption.

Figure 12:
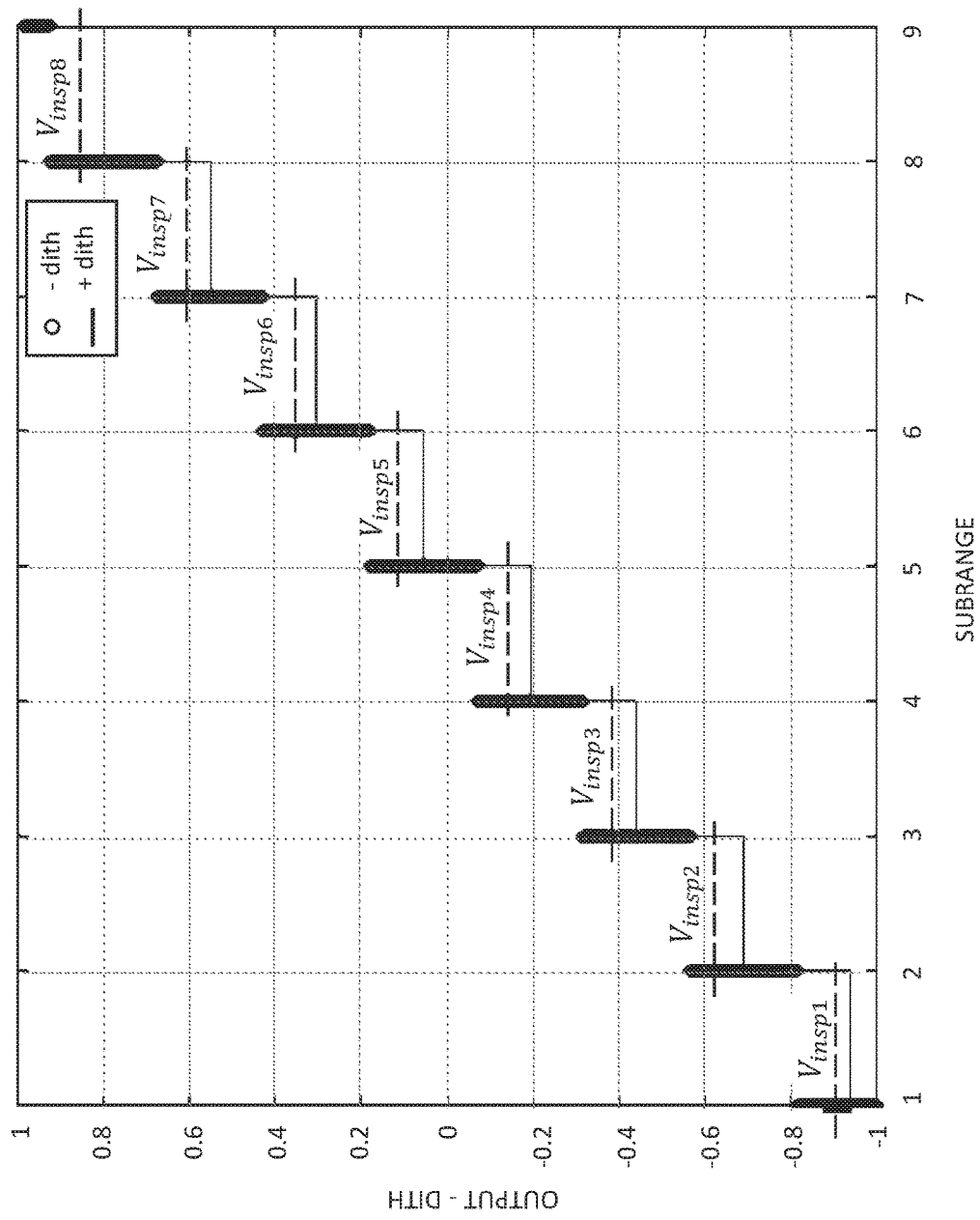
FIG. 12 shows output after dither subtraction for different subranges of the DAC for an ideal ADC, according to some embodiments of the disclosure.
Figure 13:
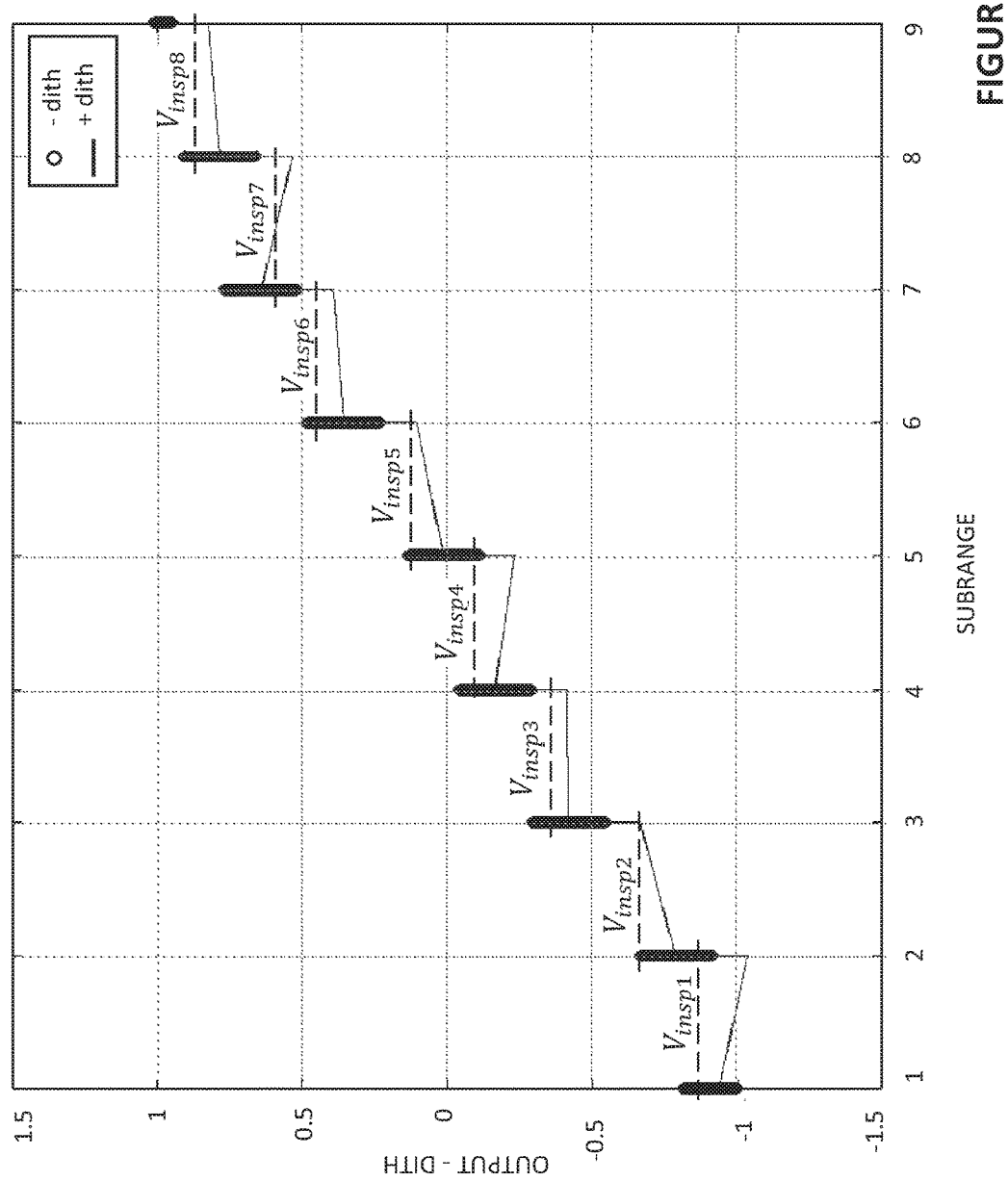
FIG. 13 shows output after dither subtraction for different subranges of the DAC for an ADC with DAC errors in the first stage, according to some embodiments of the disclosure.

FIG. 12 shows output (i.e., the digital output representing the input signal to the first stage, thus the final digital output of the ADC) after dither subtraction for different subranges of the DAC for an ideal ADC, according to some embodiments of the disclosure. FIG. 13 shows output (i.e., the digital output representing the input signal to the first stage, thus the final digital output of the ADC) after dither subtraction for different subranges of the DAC for an ADC with DAC errors in the first stage, according to some embodiments of the disclosure. The x-axis shows the subranges or flash codes ("subrange"), and the y-axis shows the output with the dither estimate subtracted ("output-dith"). Data for samples with the dither signal being positive (+dith) shows up as a thin line and data for samples with the dither signal being negative (−dith) shows up as a thick line. Exemplary inspection points are drawn on the plot as dashed lines, and in practice, an inspection point can be selected within a range of values. The inspection points can be obtained using the dither, the flash codes ("subranges", or output code of the stage), and the output values (the digital output representing the input signal to the stage) after subtracting the dither estimates ("output-dith"), based on the formulations described herein. The FIGURES help illustrate regions where the inspection points can be selected. Regions are defined as a range of values of the output with the dither estimate subtracted where the dither has caused crossing of the subranges. By examining where the thick line (representing samples of output-dith when the dither is negative, or mathematically speaking, $$(V_{out}[n] - GV_{d\_lg}[n]) |_{V_{d\_lg}<0}$$

"overlaps" with the thin line (representing samples of output-dith when the dither is positive, or mathematically speaking, $$(V_{out}[n] - GV_{d\_lg}[n]) |_{V_{d\_lg}>0}$$

vertically with respect to the y-axis for two neighboring subranges (e.g., as defined by the intersection of two sets seen in equation (4)), an inspection point can be chosen in the overlapping region. In the absence of DAC errors, the counts at each inspection point (i.e., counts of samples falling within an interval defined by an inspection point) are the same for both dither values. When there are DAC errors, the counts at each inspection point (i.e., counts of samples falling within an interval defined by an inspection point) are not the same for both dither values.

Because calibration can move the subranges and the gain estimate G may vary, the choice of the inspection points is updated continuously to respond to any changes in the subranges due to the calibration of the DAC errors, or to any other calibrations being performed in parallel. For example, the calibration of the gain error can be performed in parallel with this DAC calibration, to correct for the gain errors that the dither encounters. The gain for the large dither can be calibrated by correlating the ADC output with the dither estimate subtracted $V_{out}[n] - G[n]V_{d\_lg}[n]$ (and not the stage-1 residue) with the dither sample $V_{d\_lg}$. The gain estimate G[n] can be updated based on the following update equation based the correlation:

$$G[n+1] = G[n] + \mu \times V_{d\_lg} * (V_{out}[n] - G[n]V_{d\_lg}[n]) \quad (13)$$

This gain is used to properly subtract the injected dither (i.e., to properly form the dither estimate), and to calibrate the overall gain of the ADC. Gain estimates or changes to the gain estimates would change the inspection points, i.e., the subrange boundaries. Accordingly, the inspection points may need to be to be updated continuously, or as needed. In some cases, the calibration can begin with first subrange, and move towards the kth subrange serially. As the subranges are being adjusted, the inspection points would have to be adjusted as well.

Calibration of Reference Errors

Reference errors are caused by incomplete settling of the reference buffer. The errors can be code-dependent and input-dependent as well. The errors happen in open-loop and closed-loop MDACs, with shared and split capacitances.

Figure 14:
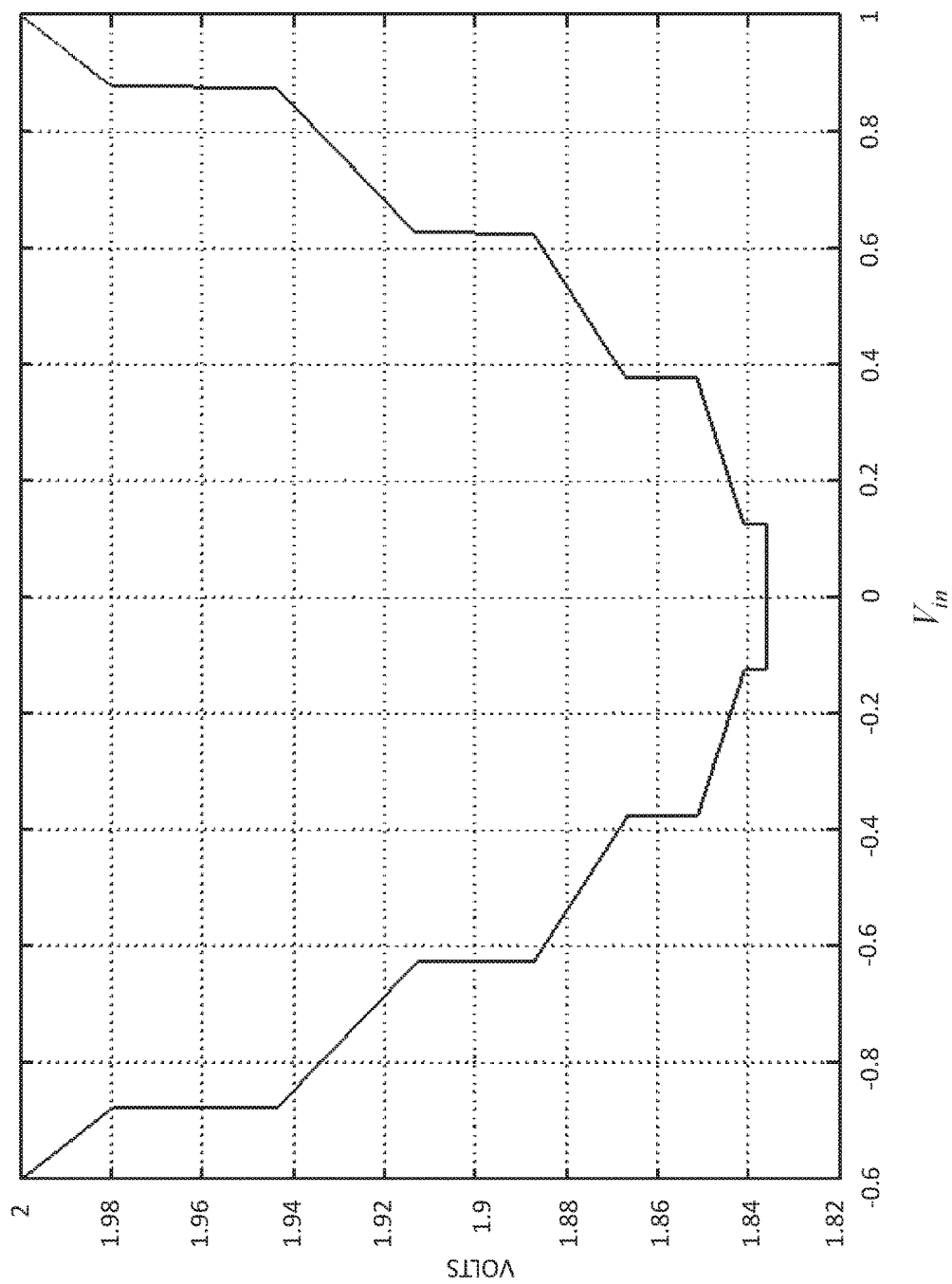
FIG. 14 shows a plot of a normalized settled reference value for an MDAC.

FIG. 14 shows a plot of a normalized settled reference value (in Volts) on the y-axis for an MDAC using a 10 Ohm reference resistance, 400 femto-Farads (fF) MDAC capacitance, and 10 pico-seconds (ps) settling time. The plot represents charge drawn during closed-loop operation, when the amplifier is in the small signal region of settling.

Figure 15:
FIG. 15 shows a plot of a reconstructed output for an MDAC.

The impact of a non-ideal reference can be seen in FIG. 15, which shows a plot of a reconstructed output for the MDAC. The reconstructed output's amplitude has INL jumps and an input-dependent HD3 shape (odd symmetry). From the plots, it can be seen that the reference errors can result in jumps between the subranges similar to the DAC errors described in the previous section. However, the error can also be input-dependent in a way that results in an overall third-order distortion as shown in FIG. 15.

Figure 16:
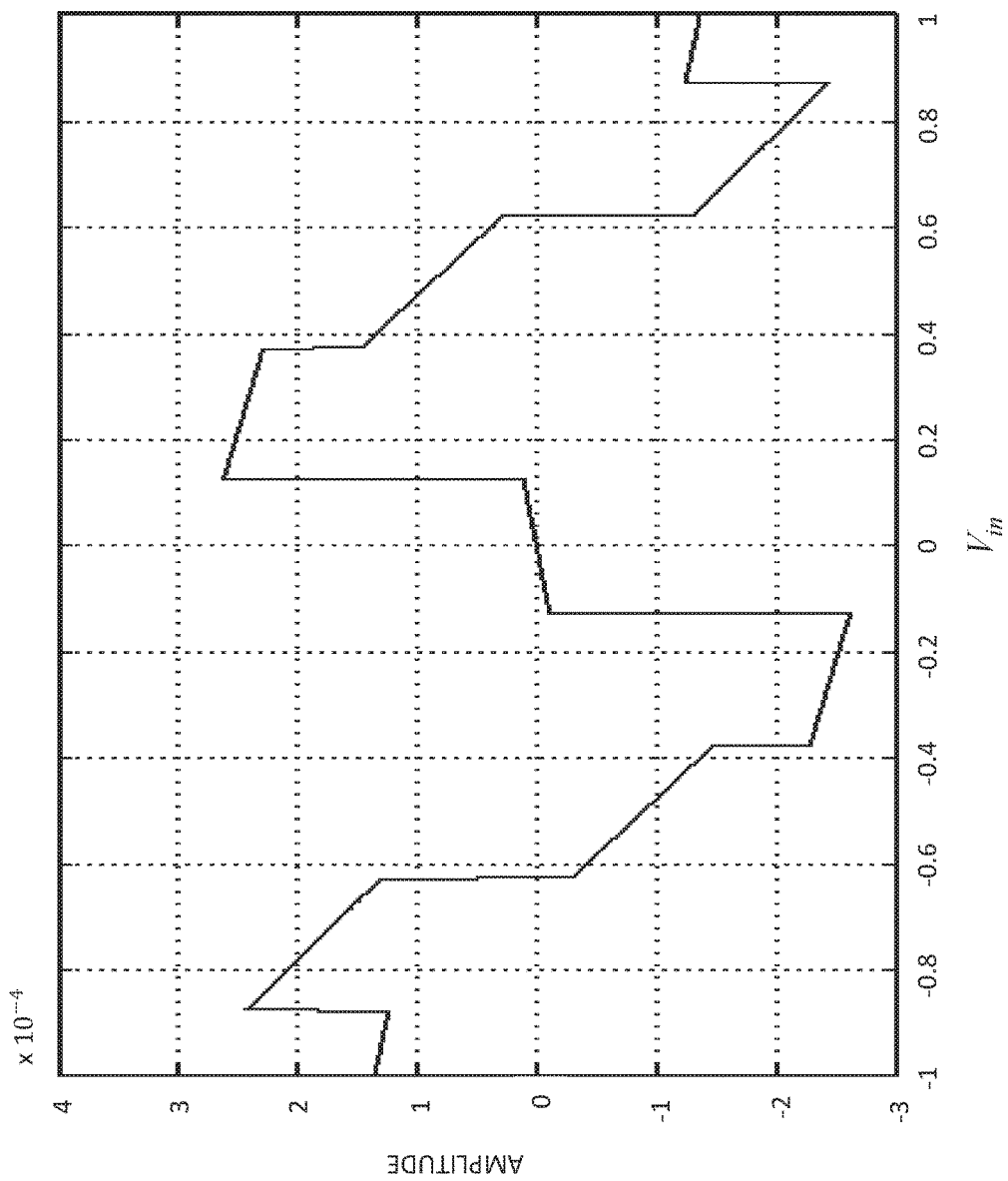
FIG. 16 shows a plot of a normalized error in a reconstructed output for a shared-capacitance open-loop MDAC.

FIG. 16 shows a plot of a normalized error in a reconstructed output for a shared-capacitance open-loop MDAC (10 Ohm reference resistance, 400 fF MDAC capacitance, and 10 ps settling time). Jumps and input-dependent shape are present.

Figure 17:
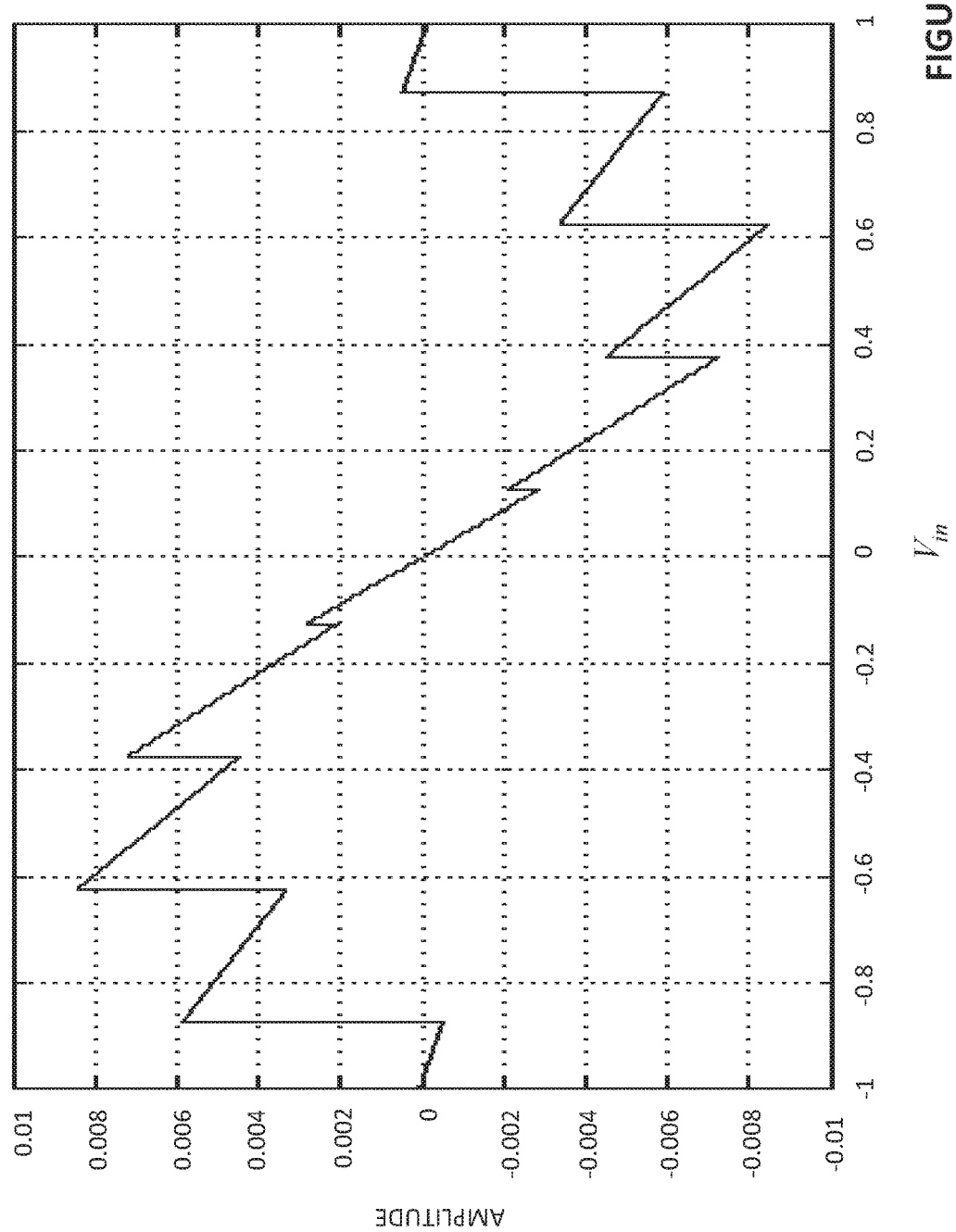
FIG. 17 shows a plot of a normalized error in a reconstructed output for a split-capacitance open-loop MDAC.

FIG. 17 shows a plot of a normalized error in a reconstructed output for a split-capacitance open-loop MDAC (10 Ohm reference resistance, 400 fF MDAC capacitance, and 10 ps settling time). The gain error term was removed to expose the non-linear term. Jumps and input-dependent shape are present.

Advantageously, the reference errors can be calibrated by combining the DAC calibration described in the previous section with an HD2/HD3 calibration using the same dither signal. Similar to the previous section, to calibrate reference errors in the first stage, the dither signal (i.e., large dither or linearization dither) used for calibration can be injected in the front-end T/H circuit or it can be injected in both the MDAC and flash ADC of the first stage as mentioned above. The calibration dither injected in the MDAC (only) to calibrate the amplifier gain error and non-linearity cannot be used directly to calibrate the reference buffer non-linearity, because the dither is injected in the MDAC only during the hold phase, and therefore does not "see" the same transfer characteristic seen by the input signal.

The dither can be used with histogram and/or correlation analysis to extract and minimize the INL jumps as described in the previous section. In addition, the second, third, or fifth-order non-linearity, which include the contribution coming from the reference buffer can be calibrated as well. Also similar to the previous section, the large dither gain G is used as part of the calibration process for reference errors, and thus the gain error may need to be estimated and calibrated (e.g., based on equation (13)).

To detect jumps, the calibration scheme utilizes the methodology described in the previous section, e.g., equations (1) to (9) as previously described if counting is used, or equations (1) to (4) and (10) to (12) if correlation is used). In addition to estimating jumps, the calibration scheme estimates the overall shape of the output transfer characteristic, which can be associated with HD2/HD3 components. This estimation can be done by estimating the variation in the dither gain term, using the histograms (counting) or correlation.

Using the histogram method, two symmetric inspection points are determined/selected: first inspection point $V_{insp}$ and second inspection point $-V_{insp}$. The symmetric inspection points are symmetric around a midpoint of input range (i.e., range of output values of the ADC or samples of the input signal to the first stage). The inspection points are chosen to expose the non-linearity (i.e., the shape), and to ensure there are sufficient number of samples within the ranges set by the inspection points to expose such non-linearity. In one example, assuming the shape is symmetric around half the range, the first and second inspection points can be selected about ¼ and ¾ of the range. In some cases, the first and second inspection points can be ⅛ and ⅞ of the range. The inspection points can also be selected based on the order of distortion that the methodology is trying to expose. Two symmetric inspection points can be selected for exposing third-order harmonic HD3. For instance, the two symmetric inspection points can correspond to, $V_{insp3}$ and $-V_{insp3}$ from the scheme described in the previous section. Two other symmetric inspection points can be selected for exposing fifth-order harmonic HD5. For instance, the two other symmetric points can correspond to $V_{insp5}$ and $-V_{insp5}$ from the scheme described in the previous section. The exact magnitudes of the inspection points are not critical, but the inspection points should be chosen to expose the harmonic, i.e., shape to be detected. For example, since second-order distortion causes symmetrical errors around the center point, while third-order distortion causes odd symmetry, the inspection points for the detection and correction of HD2 and HD3 can be at $+/-V_{insp}$, where $V_{insp}$ is an arbitrary value. For a higher order distortion (such as fifth or seventh), the inspection point needs to be at a relatively large amplitude to expose the severe compression caused by the higher order distortion. The amplitude of the inspection points for exposing higher order distortion would be greater than the amplitude of the inspection points for exposing lower order distortions. A large inspection point may be more effective in detecting the non-linearity, but may have less hits. The inspection points can also be fixed or changing (randomly or deterministically) to accommodate different input conditions. Randomly changing inspection points can avoid quantization effects. The inspection points can also adapt to changing input signal levels. Multiple inspection points can also be used to improve the convergence time and/or improve the detection effectiveness.

The errors at the inspection points can be defined as:

$$\varepsilon(V_{insp}) = Cumsump_{V_{insp}}(V_{out}[n] - GV_{d\_lg}[n])\big|_{V_{d\_lg}<0} \quad (14)$$
$$- Cumsump_{V_{insp}}(V_{out}[n] - GV_{d\_lg}[n])\big|_{V_{d\_lg}>0}$$

and $$\varepsilon(-V_{insp}) = Cumsumn_{-V_{insp}}(V_{out}[n] - GV_{d\_lg}[n])\big|_{V_{d\_lg}<0} \quad (15)$$
$$- Cumsumn_{-V_{insp}}(V_{out}[n] - GV_{d\_lg}[n])\big|_{V_{d\_lg}>0}$$

$Cumsump_{V_{insp}}$, is the cumulative count of points above the inspection point $V_{insp}$, and $Cumsumn_{-V_{insp}}$ is the cumulative count of points below the $-V_{insp}$ inspection point. Error at the first inspection point $\varepsilon(V_{insp})$ is the difference between the number of samples of the output with the dither estimate removed $V_{out}[n]-GV_{d\_lg}[n]$ above inspection point $V_{insp}$ when the dither is negative and the number of samples of the output with the dither estimate removed $V_{out}[n]-GV_{d\_lg}[n]$ above the inspection point when the dither is positive. Error at the second inspection point $\varepsilon(-V_{insp})$ is the difference between the number of samples of the output with the dither estimate removed $V_{out}[n]-GV_{d\_lg}[n]$ below the second inspection point $-V_{insp}$ when the dither is negative, and the number of samples of the output with the dither estimate removed $V_{out}[n]-GV_{d\_lg}i[n]$ below the second inspection point $-V_{insp}$ when the dither is positive.

The second-order error term $\varepsilon_{HD2}$ and third-order error term $\varepsilon_{HD3}$, exposing the characteristic shapes associated with these errors, can be defined as:

$$\varepsilon_{HD2}=\varepsilon(V_{insp})+\varepsilon(-V_{insp}) \quad (16)$$

And $$\varepsilon_{HD3}=\varepsilon(V_{insp})-\varepsilon(-V_{insp}) \quad (17)$$

Based on formulations from equations (14) and (15). The error terms assess the shape of the transfer characteristic. By formulating the errors appropriately and minimizing the errors, it is possible to "equalize" the shape of the transfer characteristic to a desired shape. The second-order error term $\varepsilon_{HD2}$ of equation (16) which would appear as even-order symmetry, is represented by the sum of the error at the first inspection point $\varepsilon(V_{insp})$ and the error at the second inspection point $\varepsilon(-V_{insp})$. The third-order error term $\varepsilon_{HD3}$ of equation (17), which would appear as odd-order symmetry, is represented by the difference of the error at the first inspection point $\varepsilon(V_{insp})$ and the error at the second inspection point $\varepsilon(-V_{insp})$.

The parameters of the second and third-order non-linearities, $\alpha_2$ and $\alpha_3$ respectively, are updated by:

$$\alpha_2(n+1)=\alpha_2(n)+\mu_2\times\varepsilon_{HD2} \quad (18)$$

And $$\alpha_3(n+1)=\alpha_3(n)+\mu_3\times\varepsilon_{HD3} \quad (19)$$

$\mu_2$ and $\mu_3$ are the LMS step sizes for the second- and third-order convergence respectively.

For HD2 and HD3 correction, the correction parameters can be applied to the (corrected) ADC output $v_{out}$ as follows:

$$v_{out_{cal}}=v_{out}+\alpha_2v_{out}^2+2\alpha_2^2v_{out}^2+\alpha_3v_{out}^3+3\alpha_3^2v_{out}^5 \quad (20)$$

Higher (e.g., not first-order, but second-order or higher) order terms of the ADC output such as $v_{out}^2$, $v_{out}^3$, $v_{out}^5$ are formed, e.g., using multipliers. Moreover, corresponding correction parameters to the higher order terms are also formed, in some cases, also using multipliers. After multiplying the ADC output terms with corresponding correction parameters, the results are summed to form the final corrected ADC output. This is done inside the convergence loop and on the corrected output. The (corrected) ADC output $v_{out_{cal}}$ is plugged back into equations (14) and (15). The higher order terms in equation (20) (e.g., $\alpha_3v_{out}^3$, $3\alpha_3^2v_{out}^5$) can be included to correct for the effects of applying the correction on the output (instead of the input, since the calibration system does not have direct access to the input). Applying the correction to the output (which is non-linear) causes the correction itself to generate higher order terms that may need to be cancelled.

Alternatively, the HD2 and HD3 terms (or other terms) can be obtained using the correlation approach. Correlation-based error terms for the first and second inspection points, $\varepsilon(V_{insp})$ and $\varepsilon(-V_{insp})$ can be formulated as follows:

$$\varepsilon(V_{insp}) = V_{d\_lg} * (V_{out}[n] - GV_{d\_lg}[n])|_{>V_{insp}} \quad (21)$$

And $$\varepsilon(-V_{insp}) = V_{d\_lg} * (V_{out}[n] - GV_{d\_lg}[n])|_{<V_{insp}} \quad (22)$$

The error at the first inspection point $\varepsilon(V_{insp})$ correlates the dither samples $V_{d\_lg}$ to and samples of the output with the dither estimate subtracted $V_{out}[n]-GV_{d\_lg}[n]$ with the condition that samples of $V_{out}[n]-GV_{d\_lg}[n]$ are above the first inspection point $V_{insp}$. The error at the second inspection point $\varepsilon(-V_{insp})$ correlates the dither samples $V_{d\_lg}$ and samples of the output with the dither estimate subtracted $V_{out}[n]-GV_{d\_lg}[n]$ with the condition that samples of $V_{out}[n]-GV_{d\_lg}[n]$ are below the second inspection point $-V_{insp}$. Results from equations (21) and (22) can then be plugged into equations (16) to (19) to estimate the HD2 and HD3 error terms and update correction parameters of the second and third-order non-linearities.

Calibration of Reference Errors on Other Dithers

Once the reference exhibits errors, its effect may not be limited to the input signal. Other signals, such as the linearization dither (e.g. large dither), and the calibration dither (e.g., Cal Dither-1 and Cal Dither-2 in FIG. 1) would suffer errors if they use the same reference. The above techniques correct for the impact of the reference errors on the input signals, but not on "other" dither signals. The following are two methods to correct for these errors in the "other" dither signals. If dither reference errors are left uncorrected, the DAC/reference error calibration schemes may be negatively affected.

In one method, the error in the dither signals can be calibrated using the reference calibration information that extracted the "jumps" to scale the reference for the other dither signals based on the subrange used. The method can extract reference errors of the dither (based on the reference calibration information) and applies correction appropriately based on the reference errors of the dither. This technique works when the other dither signals uses the same reference as the DAC, such that there is a correspondence between the reference errors in the DAC and the reference errors in the dither signals. In other words, the dither gain value that was obtained by various calibrations gets scaled by the "correct" or corresponding reference error value that is obtained from the reference calibration algorithm.

In another method, different "buckets" for the different subranges are used in the convergence of the "other" dither $V_{d_{other}}$ in question. This way, the dither convergence is forced to converge to the right reference value for each subrange through subrange dependent calibrations. Subrange dependent dither gain values can be obtained through binning by different subranges. This method defines dither reference errors separately for the subranges (i.e., binning) and drives the dither reference errors smaller over time. An appropriate LMS equation can be used to iteratively update subrange dependent gain parameter $G_{subi}$ and reduce a given dither reference error. The subrange dependent gain parameter $G_{subi}$ is updated to reduce a reference error of the dither. One exemplary LMS equation for updating a sub-range dependent gain parameter $G_{subi}$ is as follows:

$$G_{subi}[n+1] = G_{subi}[n] + \mu \cdot V_{d_{other}} * (V_{out}[n] - G_{subi}[n]V_{d_{other}}[n]) \quad (23)$$

$G_{subi}$ is the sub-range dependent gain parameter for sub-range-i. The "other" dither $V_{d_{other}}$ can refer to lower bits of the large dither, and to other dithers such as the "Cal Dither".

The LMS equation is calculated for signals in the given subrange-i. Phrased differently, equation 23 is an LMS update equation which can drive the subrange dependent gain parameter $G_{subi}$ to an appropriate value that reduces a given dither reference error. In other words, the LMS update equation drives the dither reference error, in this case $V_{d_{other}} * (V_{out}[n] - G_{subi}[n]V_{d_{other}}[n])$, smaller as the subrange dependent gain parameter $G_{subi}$ converges to the appropriate value.

Another exemplary LMS update equation has the dither reference error is defined based on the sign of the "other" dither and the sign of $V_{out}[n] - G_{subi}[n]V_{d_{other}}[n]$:

$$G_{subi}[n+1] = G_{subi}[n] + \mu \cdot \text{sign}(V_{d_{other}}) \cdot \text{sign}((V_{out}[n] - G_{subi}[n]V_{d_{other}}[n])) \quad (24)$$

Using any of the two LMS equations (Equation 23 and 24) above can correct for the impact of the reference errors on the "other" dither signals, i.e., dither reference signals that may exist in the stage, in addition to correcting the reference errors for the input signal.

Extending the Technique to Other Scenarios and Stages

The techniques described herein can be employed to calibrate other quantization non-linear errors that manifest themselves as DNL/INL jumps. The calibration techniques can utilize an additive dither to the input, and a method for the algorithm to seamlessly locate where the jumps are located in the background, as described above. In multi-step ADCs, the jumps are usually located at the boundaries of the subranges of the quantization stages (i.e., flash/SAR thresholds). Using those bits and the dither, as described above, the algorithm can efficiently locate, detect, and correct these errors. Examples of how the algorithm can be extended are described below.

In some embodiments, it is possible to correct IGE errors using the linearization (large) dither. The linearization (large) dither can be used for IGE calibration without having to add an additional IGE calibration dither. The DAC/reference error calibration techniques described herein can be used to correct for inter-stage gain error (IGE). IGE cause jumps in the INL that look like sawtooth patterns. This can be considered a special case of the DAC errors where all the jumps are equal (instead of being different). The proposed techniques described herein can locate the jumps and shift the subranges to be aligned. In this case, the DAC/reference calibration schemes would align all the segments, and therefore, get rid of the jumps. There is a remaining overall gain error of the whole ADC that can be corrected by the gain correction that is part of the DAC/REF calibration. Specifically, the overall gain calibration described in equation (13) adjusts the overall gain to correct for the resulting gain error. I, instead of injecting dither in the MDAC only to correct it, it is possible to use the DAC/reference error calibration techniques (e.g., with dither injected in both the MDAC and flash) to correct the IGE too.

Previous passages focuses on extracting and correcting DAC and reference errors in the first stage. The technique can be extended to extract and correct DAC and reference errors in subsequent/backend stages of the multi-step ADC. For backend stage(s), the estimation of the DNL/INL jump locations and magnitudes can be done in the manner described herein. However, the subranges (or output codes) used are those of the stage being calibrated. The dither can be injected at the input of the ADC and in the MDAC of the stage being calibrated. The dither can be injected in the MDAC of the previous stage. The signal of interest the input signal to the stage being calibrated (i.e., residue from the previous stage). When operating in the digital domain, the sample of the input signal to the stage is used. The sample of the input signal to the stage being calibrated would be a combination of the output code of the stage being calibrated with weighted versions of the output code(s) of one or more subsequent stages. For example, if the jumps are due to errors in stage-2 (e.g., second stage following the first stage), the subranges would be decided by the flash-2 bits (i.e., output code of the (flash) ADC in stage-2), and the inspection points can be selected to be points where the dither causes a crossing of the stage-2 subrange boundaries. The samples of the input signal to stage-2 would be a combination of the flash-2 bits and weighted versions of the digital output(s) of subsequent stages. Also, the dither can be added in a way such that the DAC and reference errors can be "seen" by stage-2.

Figure 18:
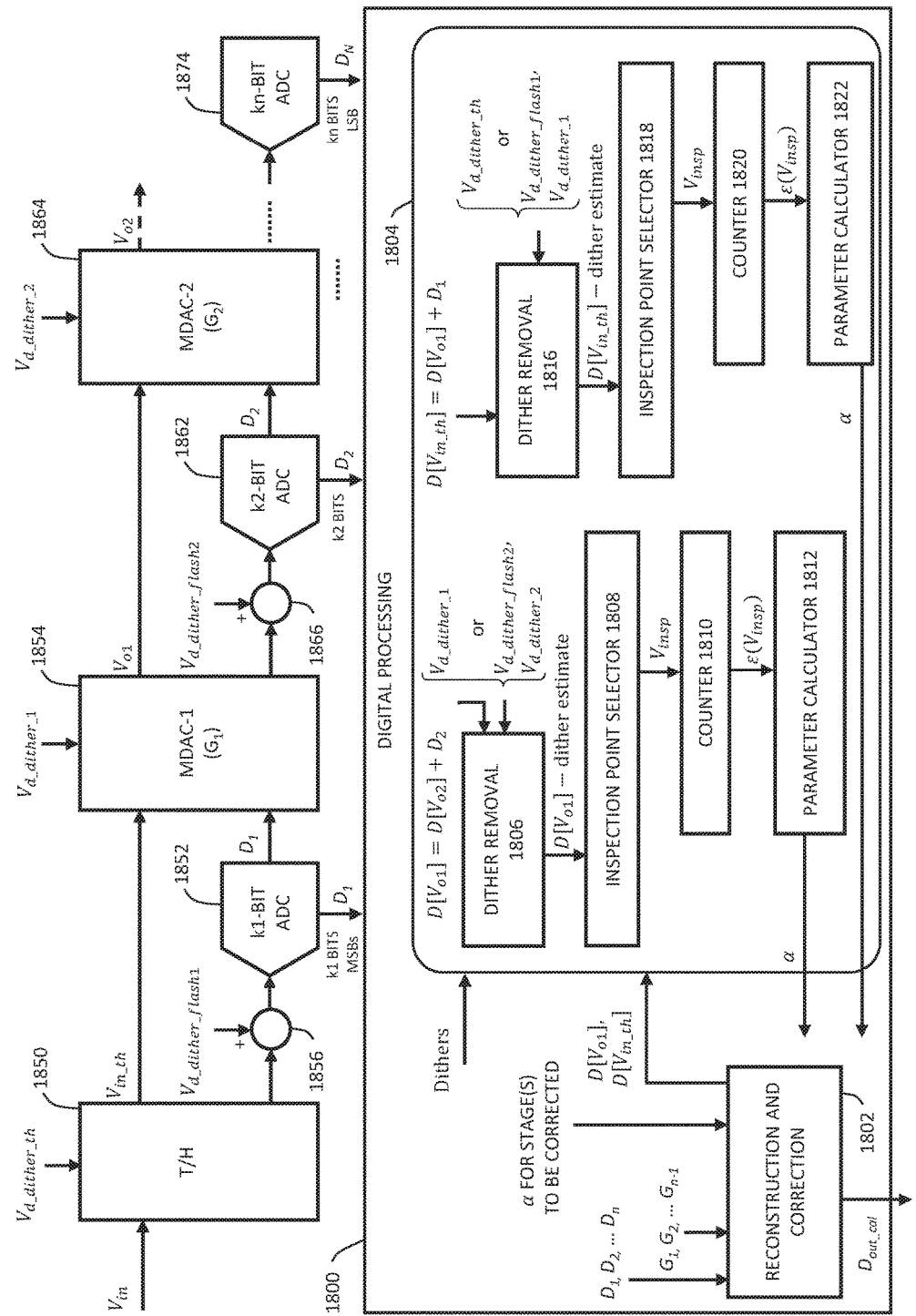
FIG. 18 shows a multi-step ADC having background calibration circuitry, according to some embodiments of the disclosure.

FIG. 18 shows a multi-step ADC having background calibration circuitry, according to some embodiments of the disclosure. Calibration can be performed one stage at a time, each using the appropriate signals for calibrating a given stage. If more than one stage is being calibrated, the calibration preferably starts from the backend stage(s) and move forward towards the first stage. For example, if a multi-step ADC has five stages (stage-1, stage-2, stage-3, stage-4, and stage-5), and the first three stages are being calibrated, the overall calibration algorithm would begin with the calibration of stage-3, stage-2, and stage-1. It is not necessary to calibrate all stages of the multi-step ADC. Generally speaking, the backend stage errors are less critical than the front-end stage errors, and thus the backend stages may not need calibration.

For simplicity, the FIGURE illustrates how the DAC and reference errors can be extracted and calibrated for the first stage (e.g., stage-1) and the second stage (e.g., stage-2). The exemplary multi-step ADC has an optional T/H circuit 1850 receiving an analog input $V_{in}$, and outputs a held signal $V_{in\_th}$. A dither $V_{d\_dither\_th}$ can be injected in the T/H circuit 1850. The first stage (e.g., stage-1) of the multi-step ADC includes a k1-bit ADC 1852 and a MDAC 1854 having a gain $G_1$. k1-bit ADC 1852 generates an output code (e.g., flash bits) $D_1$, having k1 bits. The output code $D_1$ of the first stage can correspond to the MSBs of a final output $D_{out\_cal}$ of the multi-step ADC. MDAC-1 1854 generates an amplified residue $V_{o1}$ for the following stage based on $V_{in\_th}$ or ($V_{in}$ if T/H circuit 1805 is not included) and the output code $D_1$ from k1-bit ADC 1852. A dither $V_{d\_dither\_flash1}$ can be injected at the input of k1-bit ADC 1852 using summation node 1856, and a dither $V_{d\_dither\_1}$ can be injected also in the MDAC-1 1854 (e.g., illustrated by FIGS. 4 and 8). The second stage (e.g., stage-2) of the multi-step ADC includes a k2-bit ADC 1862 and a MDAC-2 1864 having a gain $G_2$. k2-bit ADC 1862 generates an output code (e.g., flash bits) $D_2$, having k2 bits. The output code $D_2$ of the second stage can correspond to the intermediate significant bits of a final output $D_{out\_cal}$ of the multi-step ADC. MDAC-2 1864 generates an amplified residue $V_{o2}$ for the following stage based on $V_{o1}$ and the output code $D_2$ from k1-bit ADC 1852. A dither $V_{d\_dither\_flash2}$ can be injected at the input of k2-bit ADC 1862 using summation node 1866, and a dither $V_{d\_dither\_2}$ can be injected also in the MDAC 1864 (e.g., illustrated by FIGS. 4 and 8). The last stage (e.g., stage-n) of the multi-step ADC has a kn-bit ADC 1874 to generate an output code (e.g., flash bits) $D_N$, having kn bits. The output code $D_N$ of the second stage can correspond to the LSBs of a final output $D_{out\_cal}$ of the multi-step ADC.

The various output codes from the stages $D_1, D_2, \ldots D_n$ can be provided to a digital processing block 1800 for reconstruction, error extraction, and correction. Digital processing block 1800 can include reconstruction and correction block 1802, and error extraction block 1804. Digital processing block 1800 can be implemented in digital circuitry, e.g., digital logic, and/or microprocessor operating on instructions to carry out the functionalities herein. Output codes from the stages $D_1, D_2, \ldots D_n$ can be provided to reconstruction and correction 1802.

Depending on the stage being calibrated, appropriate signals are used to extract the errors. Samples of the input signal to the stage being calibrated and a dither signal that can "see" the errors are used. The construction of the sample of the input signal to the stage being calibrated using the output codes of the stage being calibrated and the stage(s) which follow the present stage can be performed in reconstruction and correction block 1802. When reconstructing the signal, gains corresponding to the stages are used to combine the output codes from the stages. In some cases, the gains of the various stages are estimated (e.g., using a scheme described herein). Moreover, the samples being used are constructed based on corrected digital outputs for a closed-loop calibration scheme.

To perform calibration of DAC errors and reference errors of the second stage, the signal of interest is the input signal to the second stage (e.g., $V_{o1}$). When operating in the digital domain, the samples of the input signal to the second stage (sample of the residue from the first stage) are used for error extraction, i.e., $D[V_{o1}]=D[V_{o2}]+D_2$. A given sample $D[V_{o1}]$ is a combination of the output code of the second stage $D_2$ and a sample of the residue of the second stage $D[V_{o2}]$. The sample of the residue of the second stage $D[V_{o2}]$ is a combination of all the output codes of the third stage onwards with proper weights (i.e., based on the gains of the various stages). If there are five stages total, $D[V_{o2}]= (D_5 \cdot G_4 + D_4) \cdot G_3 + D_3$. A dither which can "see" the errors of the second stage can include a dither $V_{d\_dither\_1}$ injected in MDAC-1 1854. Another dither which can "see" the errors of the second stage can include $V_{d\_dither\_flash2}$ and $V_{d\_dither\_2}$. A dither removal block 1806 can remove the dither from a given sample $D[V_{o1}]$. When removing the dither, an estimate of the dither is used. An inspection point selector 1808 can select inspection points (e.g., $V_{insp}$) which can expose errors in the first stage. A counter 1810, serving as circuitry to measure errors at the inspection points based on the samples with the dither removed and a polarity of the dither, can be used to count samples falling within intervals set by the inspection points (e.g., based on the techniques described herein). If the counting scheme is not used, counter 1810 can be replaced by a correlator to implement a correlation scheme. Measured errors (e.g., $\epsilon(V_{insp})$) at the inspection points can be used to compute error parameters (e.g., $\alpha$) by parameter calculator 1812 that can be used to apply correction to the second stage.

To perform calibration of DAC errors and reference errors of the first stage, the signal of interest is the input signal to the first stage (e.g., $V_{in\_th}$ or ($V_{in}$ if T/H circuit 1805 is not included). When operating in the digital domain, the samples of the input signal to the first stage are used for error extraction, i.e., $D[V_{in\_th}]=D[V_{o1}]+D_1$. A given sample $D[V_{in\_th}]$ is a combination of the output code of the first stage $D_1$ and a sample of the residue of the first stage $D[V_{o1}]$. The sample of the residue of the first stage $D[V_{o1}]$ is a combination of all the output codes of the second stage onwards with proper weights (i.e., based on the gains of the various stages). If there are five stages total, $D[V_{o1}]= ((D_5 \cdot G_4 + D_4) \cdot G_3 + D_3) \cdot G_2 + D_1$. A dither which can "see" the errors of the first stage can include a dither $V_{d\_dither\_th}$ injected in T/H circuit 1850. Another dither which can "see"

the errors of the first stage can include $V_{d\ dither\ flash1}$ and $V_{d\ dither\ 1}$. A dither removal block 1816 can remove the dither from a given sample $D[V_{in\ th}]$. When removing the dither, an estimate of the dither is used. An inspection point selector 1818 can select inspection points (e.g., $V_{insp}$) which can expose errors in the first stage. A counter 1820, serving as circuitry to measure errors at the inspection points based on the samples with the dither removed and a polarity of the dither, can be used to count samples falling within intervals set by the inspection points (e.g., based on the techniques described herein). If the counting scheme is not used, counter 1820 can be replaced by a correlator to implement a correlation scheme. Measured errors (e.g., $\varepsilon(V_{insp})$) at the inspection points can be used to compute error parameters (e.g., $\alpha$) by parameter calculator 1822 that can be used to apply correction to the second stage.

EXAMPLES

Various techniques described herein calibrate the non-linearity that is caused by the DAC and reference buffer in multi-step ADCs, such as pipelined, pipelined SAR, and sub-ranging ADCs. This non-linearity is typically caused by incomplete settling in the reference buffer, which results in DNL/INL jumps and an HD2 pattern in the reference/DAC and an HD3 in the ADC output. It can also be caused by code-dependent DAC errors due to incomplete settling and capacitance mismatches that result in a choppy INL and high order harmonics. The techniques rely on using properly injected dither and non-linear calibration algorithms to detect and correct the non-linearity in the digital domain. The calibration techniques are simple and efficient with very little overhead. They operate in the background and are independent of the input signal distribution. In the absence of an input signal, multi-level dither can be employed to detect the non-linearity.

Features for calibrating DAC non-linearity:
Using the large/linearization dither injected in both the MDAC and the flash ADC or in a previous stage to extract and calibrate the DAC non-linearity.
The methodology of identifying the inspection points (thresholds).
Using histogram/counting to extract and correct the errors.
Using correlation to extract and correct the errors.
Variants: Counting over closed intervals around the inspection points, cumulative counting above (instead of below) the inspection points, different ways to locate inspection points that expose the jumps, etc.
Features for calibrating reference non-linearity:
Using the large/linearization dither injected in both the MDAC and the flash ADC or in a previous stage to extract and calibrate the reference errors. These include BOTH DNL/INL jumps and overall HD2/HD3 non-linearities.
The methodology of identifying the inspection points (thresholds).
Using histogram/counting to extract and correct the errors.
Using correlation to extract and correct the errors.
Variants: Counting over closed intervals around the inspection points, cumulative counting above (instead of below) the inspection points, different ways to locate inspection points that expose the jumps, etc.
Features for calibrating other quantization non-linearities:
Using the large/linearization dither injected in both the MDAC and the flash ADC or in a previous stage to extract and calibrate arbitrary quantization non-linearities in the form of DNL/INL jumps that can be due to DAC, reference, amplifier, or IGE in any stage of a multi-step ADC. Phrased differently, calibrating and correcting for the non-linearities (DNL/INL jumps) regardless of their origin.
The methodology of identifying the inspection points (thresholds).
Using histogram/counting to extract and correct the errors.
Using correlation to extract and correct the errors.
Variants: Counting over closed intervals around the inspection points, cumulative counting above (instead of below) the inspection points, different ways to locate inspection points that expose the jumps, etc.

Example 1001 is a multi-step ADC comprising: at least one stage, wherein a first stage includes a feedforward DAC for reconstructing the analog input from a code generated by an ADC circuitry; circuitry for capturing samples of a dither injected at an input of the first stage and samples of an input signal of the first stage; circuitry for counting or correlating the samples of the dither and the samples of the input signal within intervals set by inspection points based on a polarity of the dither to estimate non-linearities associated with the first stage.

Figure 19:
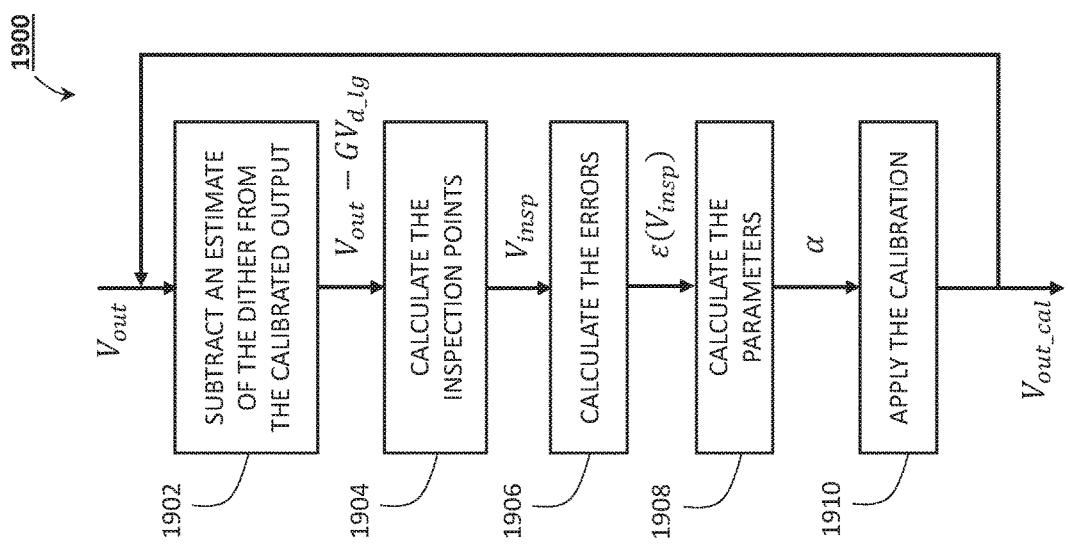
FIG. 19 is a flow diagram illustrating a method for background calibration of a multi-step ADC, according to some embodiments of the disclosure.

Example 101 is a method for background calibration of a multi-step ADC. The method is illustrated by FIG. 19. In 1902, a dither estimate is subtracted from the calibrated or corrected signal. In 1904, inspection points are determined/calculated based on the signal with the dither estimated subtracted. In 1906, errors are measured/calculated. For instance, counts are determined/calculated based on intervals set by the inspection point(s) and the polarity of the dither. In the alternative, correlation can be performed based on the intervals set by the inspection points and values of the dither. In 1908, correction parameters based on the counts or correlations can be determined/calculated. In 1910, corrections/calibrations can be applied to the output based on the correction parameters. The method can run again and return to 1902, and iteratively improve the ADC in the background. By using the corrected output of the stage, the correction parameters can converge to reduce the errors.

Example A is an apparatus comprising means for implementing/carrying out any one of the methods described herein.

Example 1 is a method for background calibration of errors in a multi-step analog to digital converter, the method comprising: injecting a dither; removing an estimate of the dither from samples of an input signal to a stage in the multi-step analog to digital converter; determining one or more inspection points; determining an error based on the samples falling within one or more intervals set by the one or more inspection points; and correcting the stage based on the error.

In Example 2, the method of Example 1 can optionally include injecting the dither comprising: injecting the dither in a track and hold circuit preceding the stage in the multi-step analog to digital converter.

In Example 3, the method of Example 1 or 2 can optionally include injecting the dither comprising: injecting the dither in a multiplying analog to digital converter of previous stage preceding the stage in the multi-step analog to digital converter.

In Example 4, the method of any one of Examples 1-3 can optionally include injecting the dither comprising: injecting the dither at an input of an analog to digital converter of the stage and in a multiplying digital to analog converter in the stage in the multi-step analog to digital converter.

In Example 5, the method of any one of Examples 1-4 can optionally include determining the one or more inspection points comprising: determining the one or more inspection points based on the samples with the estimate of the dither removed.

In Example 6, the method of any one of Examples 1-5 can optionally include determining the one or more inspection points comprising: determining a first inspection point lying at an intersection of a first set of samples of the input signal to the stage and second set of samples of the input signal to the stage, wherein: the first set of samples includes samples with the estimate of the dither removed when the dither is negative and an output code of the stage correspond to a first subrange; and the second set of samples includes samples with the estimate of the dither removed when the dither is positive and an output code of the stage correspond to a second subrange neighboring the first subrange.

In Example 7, the method of any one of Examples 1-6 can optionally include determining the one or more inspection points comprising: determining a first inspection point, wherein: the first inspection point is a maximum of a first set of samples of the input signal to the stage or a minimum of a second set of samples of the input signal to the stage; the first set of samples includes samples with the estimate of the dither removed when the dither is negative and an output code of the stage correspond to a first subrange; the second set of samples includes samples with the estimate of the dither removed when the dither is positive and an output code of the stage correspond to a second subrange neighboring the first subrange.

In Example 8, the method of any one of Examples 1-7 can optionally include counting samples with the estimate of the dither removed falling within the one or more intervals set by the one or more inspection points and based on a polarity of the dither.

In Example 9, the method of any one of Examples 1-8 can optionally include correlating samples with the estimate of the dither removed, falling within the one or more intervals set by the one or more inspection points, with values of the dither.

In Example 10, the method of any one of Examples 1-9 can optionally include updating a correction parameter based on the error and an update equation.

In Example 11, the method of any one of Examples 1-10 can optionally include correcting the stage comprising: applying a correction parameter to a digital output representing the input signal to the stage, wherein the correction parameter is selected based on an output code of the stage.

In Example 12, the method of any one of Examples 1-11 can optionally include the samples of the input signal to the stage comprising a digital output representing the input signal to the stage after one or more correction parameters have been applied in the multi-step analog to digital converter.

In Example 13, the method of any one of Examples 1-12 can optionally include determining the error comprising: determining a difference between a first number of samples with the estimate of the dither removed which are less than or equal to a first inspection point when the dither is positive and a second number of samples with the estimate of the dither removed which are less than or equal to the first inspection point when the dither is negative.

In Example 14, the method of any one of Examples 1-13 can optionally include determining the estimate of the dither by estimating a gain of the stage and multiplying the estimated gain by an ideal amplitude of the dither.

In Example 15, the method of Example 14 can optionally include estimating the gain of the stage comprising: correlating the samples of the input signal to the stage, with the estimate of the dither removed, with values of the dither.

In Example 16, the method of any one of Examples 1-15 can optionally include determining the one or more inspection points comprising: determining inspection points symmetric around a midpoint of the samples of the input signal to the stage.

In Example 17, the method of any one of Examples 1-16 can optionally include determining the one or more inspection points comprising: changing the inspection points randomly.

In Example 18, the method of any one of Examples 1-17 can optionally include determining the one or more inspection points comprising: changing the inspection points based on a signal level of the input signal to the stage.

In Example 19, the method of any one of Examples 1-18 can optionally include determining the error comprising: determining a first difference between a first number of samples, with the estimate of the dither removed, which are above a first inspection point when the dither is negative and a second number of samples, with the estimate of the dither removed, which are above the first inspection point when the dither is positive; and determining a second difference between a third number of samples, with the estimate of the dither removed, which are below a second inspection point when the dither is negative and a fourth number of samples, with the estimate of the dither removed, which are below the second inspection point when the dither is positive.

In Example 20, the method of Example 19 can optionally include determining the error comprising: summing the first difference and the second difference.

In Example 21, the method of Example 19 or 20 can optionally include determining the error comprising: determining a further difference between the first difference and the second difference.

In Example 22, the method of any one of Examples 1-21 can optionally include determining the error comprising: determining a first correlation between samples, with the estimate of the dither removed, which are above a first inspection point and values of the dither; determining a second correlation between samples, with the estimate of the dither removed, which are below a second inspection point and values of the dither; and determining the error based on the first correlation and the second correlation In Example 23, the method of any one of Examples 1-22 can optionally include correcting the stage comprising: forming one or more higher order terms of a digital output representing the input signal to the stage; applying corresponding correction parameters to the one or more higher order terms; and adding the one or more higher order terms to the digital output representing the input signal to the stage.

In Example 24, the method of any one of Examples 1-23 can optionally include correcting the stage comprising: correcting a reference error of the dither based on the error.

In Example 25, the method of any one of Examples 1-24 can optionally include updating a subrange dependent gain parameter to reduce a reference error of the dither.

Example 26 is a method for background calibration of errors in a multi-step analog to digital converter, the method comprising: determining a first inspection point and a first interval defined by the first inspection point; exposing an error at the first inspection point by determining a first difference between (1) samples of an input signal to a stage in the multi-step analog to digital converter with an estimate of a dither removed falling within the first interval when the dither is positive and (2) samples of the input signal to the stage with the estimate of the dither removed falling within the first interval when the dither is negative; and correcting a digital output representing the input signal to the stage based on the first difference to reduce the error in the stage.

In Example 27, the method of Example 26 can optionally include the first inspection point being a value where the dither causes a crossing between two neighboring subranges of the stage.

In Example 28, the method of Example 26 or 27 can optionally include determining the first difference comprising: accumulating a first number of samples in (1) and a second number of samples in (2); subtracting the first number by the second number.

In Example 29, the method of any one of Examples 26-28 can optionally include determining a second inspection point and a second interval defined by the second inspection point, wherein the first and second inspection points are symmetric around a midpoint of the stage; wherein exposing the error further includes determining a second difference between (1) samples of the input signal to the stage with the estimate of the dither removed falling within the second interval when the dither is positive and (2) samples of the input signal to the stage with the estimate of the dither removed falling within the second interval when the dither is negative; and wherein correcting the digital output further comprises correcting the digital output based on both the first difference and the second difference to reduce the error in the stage.

In Example 30, the method of any one of Examples 26-29 can optionally include determining the first difference comprising: correlating the samples of the input signal to the stage in the multi-step analog to digital converter with an estimate of a dither removed falling within the first interval with values of the dither corresponding to the samples.

Example 31 is a multi-step analog to digital converter (ADC) with background calibration of non-linearities, comprising: a plurality of stages generating respective output codes; circuitry to inject a dither to a stage; inspection point selector to select inspection points where the dither exposes errors in the stage; circuitry to measure the errors at the inspection points based on samples of an input signal to the stage with an estimate of the dither removed and a polarity of the dither; and circuitry to apply digital correction to reduce the errors.

In Example 32, the multi-step ADC of Example 31 can optionally include the inspection points being selected where the dither causes crossings between subranges of the stage.

In Example 33, the multi-step ADC of Example 31 or 32 can optionally include the inspection points are symmetric.

In Example 34, the multi-step ADC of any one of Examples 31-33 can optionally include the circuitry to measure the errors comprising: a counter to count the samples within intervals set by the inspection points based on the polarity of the dither.

In Example 35, the multi-step ADC of any one of Examples 31-34 can optionally include the circuitry to measure the errors comprising: a correlator to correlate the samples within intervals set by the inspection points against values of the dither corresponding to the samples.

In Example 36, the multi-step ADC of any one of Examples 31-35 can optionally include the circuitry to inject the dither comprises: a summation node in front of an ADC in the stage to add the dither; and a capacitor to inject the dither in a multiplying digital to analog converter in the stage.

In Example 37, the multi-step ADC of any one of Examples 31-36 can optionally include: a track and hold circuit comprising a switched-capacitor network; wherein the circuitry to inject the dither comprises a capacitor to inject the dither in the switched-capacitor network.

Variations and Implementations

Herein, switches represents electronic circuitry which can be controlled to conduct current or not conduct current. In practice, switches can be implemented using transistors. By biasing the transistors appropriately, the transistor can conduct current or not conduct current (be "on" or "off" respectively). When the switch is closed or "on", current conducts to complete the circuit path. When a switch is opened or "off", current does not conduct and the circuit path is open. Switches can effectively connect one part of a circuit to another part of a circuit, or disconnect one part of a circuit to another part of a circuit.

Note that the activities discussed above with reference to the FIGURES are applicable to any integrated circuits that involve processing analog signals and converting the analog signals into digital data using one or more ADCs. The features can be particularly beneficial to high speed ADCs, where input frequencies are relatively high in the giga-Hertz range. The ADC can be applicable to medical systems, scientific instrumentation, wireless and wired communications systems (especially systems requiring a high sampling rate), radar, industrial process control, audio and video equipment, instrumentation, and other systems which uses ADCs. The level of performance offered by high speed ADCs can be particularly beneficial to products and systems in demanding markets such as high speed communications, medical imaging, synthetic aperture radar, digital beam-forming communication systems, broadband communication systems, high performance imaging, and advanced test/measurement systems (oscilloscopes).

The present disclosure encompasses apparatuses which can perform the various methods described herein. Such apparatuses can include circuitry illustrated by the FIGURES and described herein. Parts of various apparatuses can include electronic circuitry to perform the functions described herein. The circuitry can operate in analog domain, digital domain, or in a mixed-signal domain. In some cases, one or more parts of the apparatus can be provided by a processor specially configured for carrying out the functions described herein (e.g., control-related functions, timing-related functions). In some cases that processor can be an on-chip processor with the ADC. The processor may include one or more application specific components, or may include programmable logic gates which are configured to carry out the functions describe herein. In some instances, the processor may be configured to carrying out the functions described herein by executing one or more instructions stored on a non-transitory computer medium.

In one example embodiment, any number of components of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the components of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on-chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the error calibration functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims (if any) or examples described herein. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims (if any) or examples described herein. The description and drawings are, accordingly, to be regarded in an illustrative rather than in a restrictive sense.

Note that with the numerous examples provided herein, interaction may be described in terms of two, three, four, or more electrical components or parts. However, this has been done for purposes of clarity and example only. It should be appreciated that the system can be consolidated in any suitable manner. Along similar design alternatives, any of the illustrated components, modules, blocks, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments. It is also important to note that the functions described herein illustrate only some of the possible functions that may be executed by, or within, systems/circuits illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure. Numerous other changes, substitutions, variations, alterations, and modifications may be ascertained to one skilled in the art and it is intended that the present disclosure encompass all such changes, substitutions, variations, alterations, and modifications as falling within the scope of the appended claims (if any) or examples described herein. Note that all optional features of the apparatus described above may also be implemented with respect to the method or process described herein and specifics in the examples may be used anywhere in one or more embodiments.

What is claimed is:

1. A method for background calibration of errors in a multi-step analog to digital converter, the method comprising:
    injecting a dither;
    removing an estimate of the dither from samples of an input signal to a stage in the multi-step analog to digital converter;
    determining one or more inspection points;
    determining an error based on the samples falling within one or more intervals set by the one or more inspection points; and
    correcting the stage based on the error.

2. The method of claim 1, wherein determining the one or more inspection points comprises:
    determining the one or more inspection points based on the samples with the estimate of the dither removed.

3. The method of claim 1, wherein determining the one or more inspection points comprises:
    determining a first inspection point lying at an intersection of a first set of samples of the input signal to the stage and second set of samples of the input signal to the stage, wherein:
        the first set of samples includes samples with the estimate of the dither removed when the dither is negative and an output code of the stage correspond to a first subrange; and the second set of samples includes samples with the estimate of the dither removed when the dither is positive and an output code of the stage correspond to a second subrange neighboring the first subrange.

4. The method of claim 1, wherein determining the one or more inspection points comprises:
determining a first inspection point, wherein:
the first inspection point is a maximum of a first set of samples of the input signal to the stage or a minimum of a second set of samples of the input signal to the stage;
the first set of samples includes samples with the estimate of the dither removed when the dither is negative and an output code of the stage correspond to a first subrange;
the second set of samples includes samples with the estimate of the dither removed when the dither is positive and an output code of the stage correspond to a second subrange neighboring the first subrange.

5. The method of claim 1, further comprising:
counting samples with the estimate of the dither removed falling within the one or more intervals set by the one or more inspection points and based on a polarity of the dither.

6. The method of claim 1, further comprising:
correlating samples with the estimate of the dither removed, falling within the one or more intervals set by the one or more inspection points, with values of the dither.

7. The method of claim 1, wherein correcting the stage comprises:
applying a correction parameter to a digital output representing the input signal to the stage, wherein the correction parameter is selected based on an output code of the stage.

8. The method of claim 1, wherein determining the error comprises:
determining a difference between a first number of samples with the estimate of the dither removed which are less than or equal to a first inspection point when the dither is positive and a second number of samples with the estimate of the dither removed which are less than or equal to the first inspection point when the dither is negative.

9. The method of claim 1, further comprising:
determining the estimate of the dither by estimating a gain of the stage and multiplying the estimated gain by an ideal amplitude of the dither.

10. The method of claim 9, wherein estimating the gain of the stage comprises:
correlating the samples of the input signal to the stage, with the estimate of the dither removed, with values of the dither.

11. The method of claim 1, wherein determining the one or more inspection points comprises:
determining inspection points symmetric around a midpoint of the samples of the input signal to the stage.

12. The method of claim 1, wherein determining the one or more inspection points comprises:
changing the inspection points randomly.

13. The method of claim 1, wherein determining the error comprises:
determining a first difference between a first number of samples, with the estimate of the dither removed, which are above a first inspection point when the dither is negative and a second number of samples, with the estimate of the dither removed, which are above the first inspection point when the dither is positive; and
determining a second difference between a third number of samples, with the estimate of the dither removed, which are below a second inspection point when the dither is negative and a fourth number of samples, with the estimate of the dither removed, which are below the second inspection point when the dither is positive.

14. The method of claim 13, wherein determining the error comprises:
summing the first difference and the second difference.

15. The method of claim 13, wherein determining the error comprises:
determining a further difference between the first difference and the second difference.

16. The method of claim 1, wherein correcting the stage comprises:
forming one or more higher order terms of a digital output representing the input signal to the stage;
applying corresponding correction parameters to the one or more higher order terms; and
adding the one or more higher order terms to the digital output representing the input signal to the stage.

17. The method of claim 1, wherein injecting the dither comprises:
injecting the dither in a track and hold circuit preceding the stage in the multi-step analog to digital converter.

18. The method of claim 1, wherein injecting the dither comprises:
injecting the dither in a multiplying analog to digital converter of previous stage preceding the stage in the multi-step analog to digital converter.

19. The method of claim 1, wherein injecting the dither comprises:
injecting the dither at an input of an analog to digital converter of the stage and in a multiplying digital to analog converter in the stage in the multi-step analog to digital converter.

20. The method of claim 1, further comprising:
updating a correction parameter based on the error and an update equation.

21. The method of claim 1, wherein the samples of the input signal to the stage comprises a digital output representing the input signal to the stage after one or more correction parameters have been applied in the multi-step analog to digital converter.

22. The method of claim 1, wherein determining the one or more inspection points comprises:
changing the inspection points based on a signal level of the input signal to the stage.

23. The method of claim 1, wherein determining the error comprises:
determining a first correlation between samples, with the estimate of the dither removed, which are above a first inspection point and values of the dither; and
determining a second correlation between samples, with the estimate of the dither removed, which are below a second inspection point and values of the dither; and
determining the error based on the first correlation and the second correlation.

24. The method of claim 1, wherein correcting the stage comprises:
correcting a reference error of the dither based on the error.

25. The method of claim 1, further comprising:
updating a subrange dependent gain parameter to reduce a reference error of the dither.

26. A method for background calibration of errors in a multi-step analog to digital converter, the method comprising:
- determining a first inspection point and a first interval defined by the first inspection point;
- exposing an error at the first inspection point by determining a first difference between (1) samples of an input signal to a stage in the multi-step analog to digital converter with an estimate of a dither removed falling within the first interval when the dither is positive and (2) samples of the input signal to the stage with the estimate of the dither removed falling within the first interval when the dither is negative; and
- correcting a digital output representing the input signal to the stage based on the first difference to reduce the error in the stage.

27. The method of claim 26, wherein determining the first difference comprises:
- accumulating a first number of samples in (1) and a second number of samples in (2); and
- subtracting the first number by the second number.

28. The method of claim 26, further comprising:
- determining a second inspection point and a second interval defined by the second inspection point, wherein the first and second inspection points are symmetric around a midpoint of the stage;
- wherein exposing the error further includes determining a second difference between (1) samples of the input signal to the stage with the estimate of the dither removed falling within the second interval when the dither is positive and (2) samples of the input signal to the stage with the estimate of the dither removed falling within the second interval when the dither is negative; and
- wherein correcting the digital output further comprises correcting the digital output based on both the first difference and the second difference to reduce the error in the stage.

29. The method of claim 26, wherein the first inspection point is a value where the dither causes a crossing between two neighboring subranges of the stage.

30. The method of claim 26, wherein determining the first difference comprises:
correlating the samples of the input signal to the stage in the multi-step analog to digital converter with an estimate of a dither removed falling within the first interval with values of the dither corresponding to the samples.

31. A multi-step analog to digital converter (ADC) with background calibration of non-linearities, comprising:
- a plurality of stages generating respective output codes;
- circuitry to inject a dither to a stage;
- inspection point selector to select inspection points where the dither exposes errors in the stage;
- circuitry to measure the errors at the inspection points based on samples of an input signal to the stage with an estimate of the dither removed and a polarity of the dither; and
- circuitry to apply digital correction to reduce the errors.

32. The multi-step ADC of claim 31, wherein the inspection points are selected where the dither causes crossings between subranges of the stage.

33. The multi-step ADC of claim 31, wherein the inspection points are symmetric.

34. The multi-step ADC of claim 31, wherein the circuitry to measure the errors comprises a counter to count the samples within intervals set by the inspection points based on the polarity of the dither.

35. The multi-step ADC of claim 31, wherein the circuitry to measure the errors comprises a correlator to correlate the samples within intervals set by the inspection points against values of the dither corresponding to the samples.

36. The multi-step ADC of claim 31, wherein the circuitry to inject the dither comprises:
- a summation node in front of an ADC in the stage to add the dither; and
- a capacitor to inject the dither in a multiplying digital to analog converter in the stage.

37. The multi-step ADC of claim 31, further comprising:
a track and hold circuit comprising a switched-capacitor network;
wherein the circuitry to inject the dither comprises a capacitor to inject the dither in the switched-capacitor network.

* * * * *